US012575251B2

(12) United States Patent
Jung et al.

(10) Patent No.: US 12,575,251 B2
(45) Date of Patent: Mar. 10, 2026

(54) LIGHT-EMITTING ELEMENT COMPRISING QUANTUM DOTS, DISPLAY DEVICE INCLUDING THE SAME, AND MANUFACTURING METHOD OF THE LIGHT-EMITTING ELEMENT

(71) Applicant: Samsung Display Co., Ltd., Yongin-si (KR)

(72) Inventors: Yunku Jung, Cheonan-si (KR); Hyekyoung Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 294 days.

(21) Appl. No.: 17/450,130

(22) Filed: Oct. 6, 2021

(65) Prior Publication Data

US 2022/0216441 A1 Jul. 7, 2022

(30) Foreign Application Priority Data

Jan. 4, 2021 (KR) ........................ 10-2021-0000381

(51) Int. Cl.
*H10K 50/115* (2023.01)
*H10K 50/15* (2023.01)
(Continued)

(52) U.S. Cl.
CPC ........... *H10K 50/115* (2023.02); *H10K 50/15* (2023.02); *H10K 71/40* (2023.02)

(58) Field of Classification Search
None
See application file for complete search history.

(56) References Cited

U.S. PATENT DOCUMENTS 10,808,174 B2 10/2020 Park et al.
2015/0076469 A1* 3/2015 Ikemizu ................ H10K 50/11 257/40

(Continued)

FOREIGN PATENT DOCUMENTS

KR 10-2016-0080077 A 7/2016
KR 20180077086 A 7/2018
KR 10-2021-0036435 A 4/2021

OTHER PUBLICATIONS

Chia-Hao M. Chuang, et al., Improved performance and stability in quantum dot solar cells through band alignment engineering, Letters Nature Materials, 2014, pp. 796-801, vol. 13, Macmillan Publishers Limited.

(Continued)

*Primary Examiner* — Sue A Purvis
*Assistant Examiner* — Seyon Ali-Simah Punchbeddell
(74) *Attorney, Agent, or Firm* — Womble Bond Dickinson (US) LLP

(57) ABSTRACT

A method of manufacturing a light-emitting element includes forming a first electrode, forming a hole transport region by providing a hole transport material on the first electrode, forming a light-emitting layer on the hole transport region, forming an electron transport region on the light-emitting layer, and forming a second electrode on the electron transport region, wherein the forming of the light-emitting layer includes providing, on the hole transport region, a quantum dot composition including an organic solvent and a plurality of quantum dots, heat-treating the quantum dot composition, and vacuum-drying the heat-treated quantum dot composition, so that a light-emitting element in which quantum dots have infiltrated into the hole transport region may be manufactured.

12 Claims, 15 Drawing Sheets

(51) Int. Cl.

| | |
|---|---|
| *H10K 71/00* | (2023.01) |
| *H10K 71/40* | (2023.01) |

(56) References Cited

U.S. PATENT DOCUMENTS

| | | | | |
|---|---|---|---|---|
| 2016/0233449 | A1* | 8/2016 | Murayama | C09K 11/565 |
| 2017/0271605 | A1* | 9/2017 | Steckel | H10K 50/155 |
| 2018/0179441 | A1* | 6/2018 | Park | G02B 5/22 |
| 2021/0091324 | A1 | 3/2021 | Jung et al. | |
| 2022/0158106 | A1* | 5/2022 | Angioni | H10K 50/16 |
| 2023/0180496 | A1* | 6/2023 | Kanehiro | H10K 50/115 257/40 |

OTHER PUBLICATIONS

Patrick R. Brown, et al., Energy Level Modification in Lead Sulfide Quantum Dot Thin Films through Ligand Exchange, Article ACSNANO, 2014, pp. 5863-5872, vol. 8, No. 6, American Chemical Society.

* cited by examiner

LIGHT-EMITTING ELEMENT COMPRISING QUANTUM DOTS, DISPLAY DEVICE INCLUDING THE SAME, AND MANUFACTURING METHOD OF THE LIGHT-EMITTING ELEMENT

CROSS-REFERENCE TO RELATED APPLICATION

This application claims priority to and the benefit of Korean Patent Application No. 10-2021-0000381, filed on Jan. 4, 2021, the entire content of which is hereby incorporated by reference.

BACKGROUND

1. Field

The present disclosure herein relates to a light-emitting element including a light-emitting layer including a quantum dot, a display device including the same, and a manufacturing method of the light-emitting element.

2. Description of the Related Art

Various suitable display devices utilized in multimedia devices such as a television, a mobile phone, a tablet computer, a navigation system, and/or a game console are being developed. In such a display device, a so-called self-luminous display element is utilized to achieve display of images by causing a light-emitting material containing an organic compound to emit light.

In addition, the development of a light-emitting element utilizing quantum dots as a light-emitting material is being pursued in order to improve the color reproducibility of a display device, and there is a need to improve the luminous efficiency of a light-emitting element utilizing quantum dots.

SUMMARY

One or more aspects according to embodiments of the present disclosure are directed toward a light-emitting element having a low driving voltage and a suitable (e.g., excellent) luminous efficiency, and a display device including the same.

One or more aspects according to embodiments of the present disclosure are directed toward a manufacturing method of a light-emitting element capable of diffusing quantum dots from a light-emitting layer into a hole transport region.

According to one or more embodiments of the present disclosure, a method of manufacturing a light-emitting element includes forming a first electrode; forming a hole transport region by providing a hole transport material on the first electrode; forming a light-emitting layer on the hole transport region; forming an electron transport region on the light-emitting layer; and forming a second electrode on the electron transport region, wherein the forming of the light-emitting layer includes providing on the hole transport region, a quantum dot composition including an organic solvent and a plurality of quantum dots; heat-treating the quantum dot composition to provide a heat-treated quantum dot composition; and vacuum-drying the heat-treated quantum dot composition.

In an embodiment, the heat-treating of the quantum dot composition may include dissolving the hole transport material in the organic solvent; and diffusing at least some of the plurality of quantum dots into the hole transport region.

In an embodiment, the vacuum-drying of the heat-treated quantum dot composition may include removing the organic solvent.

In an embodiment, the heat-treating of the quantum dot composition may be performed at about 50° C. to about 200° C.

In an embodiment, the heat-treating of the quantum dot composition may include forming a first portion (e.g., a first portion of the hole transport region) including at least some of the plurality of quantum dots in the hole transport region; and forming a second portion (e.g., a second portion of the hole transport region) not including the quantum dots (e.g., not including any quantum dots) and more adjacent to the first electrode than the first portion.

In an embodiment, the plurality of quantum dots may be about 2 wt % to about 15 wt % in amount with respect to a total weight of the quantum dot composition In an embodiment, the organic solvent may include at least one of phenylcyclohexane, n-octylbenzene, dodecylbenzene, 1-ethyl naphthalene, or diisopropyl biphenyl.

In an embodiment, the forming of the electron transport region may include providing an electron transport material on the light-emitting layer; vacuum-drying the electron transport material to provide a vacuum-dried electron transport material; and heat-treating the vacuum-dried electron transport material.

In an embodiment of the present disclosure, a light-emitting element includes a first electrode; a light-emitting layer on the first electrode and including quantum dots; a hole transport region between the first electrode and the light-emitting layer and including quantum dots the same as those included in the light-emitting layer; an electron transport region on the light-emitting layer; and a second electrode on the electron transport region.

In an embodiment, the hole transport region may be divided into (e.g., may include) a first portion including the quantum dots and a second portion not including the quantum dots.

In an embodiment, the hole transport region may include a plurality of organic layers, and an organic layer most adjacent to the light-emitting layer from among the plurality of organic layers may include the quantum dots.

In an embodiment, the hole transport region may include a hole injection layer and a hole transport layer on the hole injection layer, and the hole transport layer may include the quantum dots, and the hole injection layer may not include the quantum dots.

In an embodiment, the hole transport layer may be divided into (e.g., may include) a third portion including the quantum dots and a fourth portion not including the quantum dots, and the third portion may be more adjacent to the light-emitting layer than the fourth portion.

In an embodiment, a thickness of the third portion may be smaller than a thickness of the fourth portion.

In an embodiment, in the third portion, a distribution density of the quantum dots in a portion adjacent to the light-emitting layer may be greater than a distribution density of the quantum dots in a portion adjacent to the fourth portion.

In an embodiment, a distribution density of the quantum dots may decrease from the third portion to the fourth portion.

In an embodiment of the present disclosure, a display device includes first to third light-emitting elements that emit light having different wavelengths, wherein each of the first to third light-emitting elements includes a first electrode; a light-emitting layer on the first electrode and including quantum dots; a hole transport region between the first electrode and the light-emitting layer and including quantum dots the same as those included in the light-emitting layer; an electron transport region on the light-emitting layer; and a second electrode on the electron transport region.

In an embodiment, the first light-emitting element may include a first light-emitting layer including first quantum dots to emit blue light, the second light-emitting element may include a second light-emitting layer including second quantum dots to emit green light, and the third light-emitting element may include a third light-emitting layer including third quantum dots to emit red light.

In an embodiment, the first light-emitting element may include a first hole transport region including the first quantum dots under the first light-emitting layer, the second light-emitting element may include a second hole transport region including the second quantum dots under the second light-emitting layer, and the third light-emitting element may include a third hole transport region including the third quantum dots under the third light-emitting layer.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
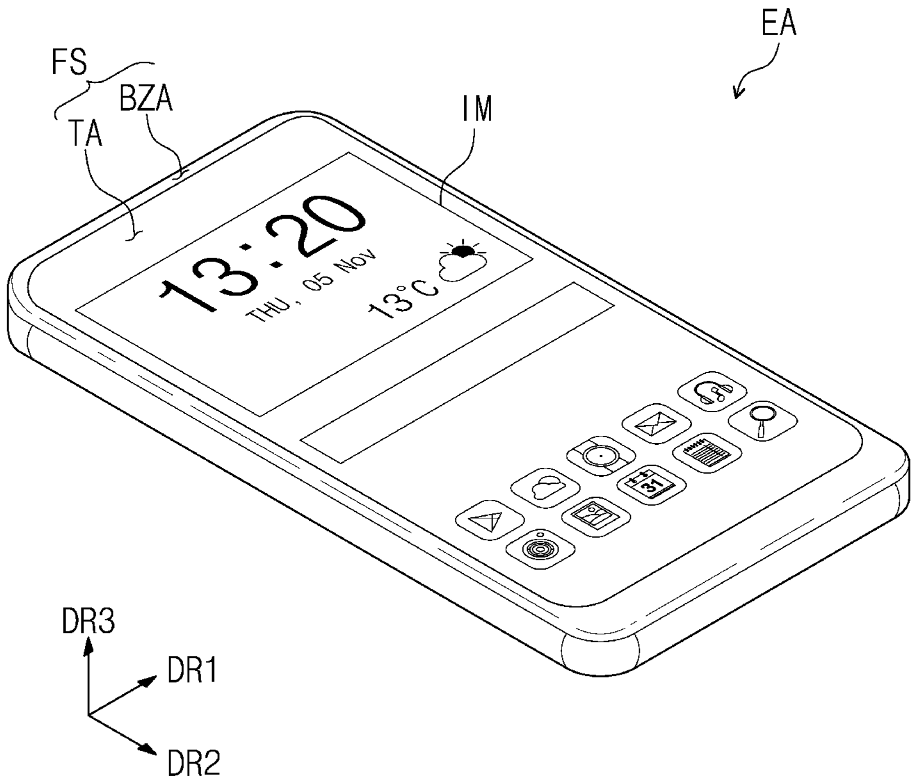
FIG. 1 is a perspective view illustrating an electronic device according to an embodiment.

As the present disclosure allows for various suitable changes and numerous embodiments, particular embodiments will be illustrated in the drawings and described in more detail in the text. However, this is not intended to limit the present disclosure to the specific disclosed form, and it should be understood to include all modifications, equivalents, and substitutes included in the spirit and scope of the present disclosure.

It will be understood that when an element or layer is referred to as being "on", "connected to" or "coupled to" another element or layer, it can be directly on, connected or coupled to the other element or layer (without any intervening elements or layers therebetween), or intervening elements or layers may be present.

On the other hand, in the present application, "directly disposed" or "directly on" refers to that there is no layer, film, region, plate, and/or the like added between the portion of the layer, film, region, plate, and/or the like. For example, "directly disposed" or "directly on" may refer to a layer or a member on (e.g., disposed on) another layer or member without additional members, such as adhesive members, between the two layers or two members.

Like numbers refer to like elements throughout. In the drawings, the thickness, the ratio, and the dimension of the element(s) may be exaggerated for effective description of the technical contents.

In the present specification, the term "and/or" includes any and all combinations of one or more of the associated listed items. Further, the use of "may" when describing embodiments of the present disclosure refers to "one or more embodiments of the present disclosure".

The terms first, second, etc. may be used to describe various elements, but the elements should not be limited by the terms. The terms are used only for the purpose of distinguishing one component from another. For example, without departing from the scope of the present disclosure, the first component may be referred to as a second component, and similarly, the second component may also be referred to as a first component. Singular expressions include plural expressions unless the context clearly indicates otherwise.

In addition, terms such as "below", "under", "above", "on", etc. are used to describe the relationship between the components shown in the drawings. The terms are relative concepts and are explained based on the directions indicated in the drawings.

Unless otherwise defined, all terms (including technical and scientific terms) used herein have the same meaning as commonly understood by one of ordinary skill in the art to which this disclosure belongs. In addition, it will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terms "include," "comprise," and "have" are intended to indicate the presence of a feature, number, step, action, component, part, or combination thereof described in the specification, but do not preclude the presence or addition of one or more other features, numbers, or steps. It should be understood that it does not preclude the possibility of the existence or addition of an additional feature, number, step, action, component, part, or combination thereof.

The term "substituted or unsubstituted" in the present specification may refer to at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents described (e.g., exemplified) above may be substituted or unsubstituted. For example, the biphenyl group may be interpreted as an aryl group and may also be interpreted as a phenyl group substituted with a phenyl group.

In the present specification, examples of the halogen atom may include a fluorine atom, a chlorine atom, a bromine atom, or an iodine atom.

In the present specification, the alkyl group may be straight, branched or cyclic. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3, 3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-icosyl group, a 2-ethylicosyl group, a 2-butylicosyl group, a 2-hexylicosyl group, a 2-octylicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, and/or the like, but the present disclosure is not limited thereto.

In the present specification, a hydrocarbon ring group may refer to any functional group or substituent derived from an aliphatic hydrocarbon ring. The hydrocarbon cyclic group may be a saturated hydrocarbon cyclic group having 5 to 20 ring-forming carbon atoms.

In the present specification, the aryl group may refer to a monovalent group having a carbocyclic aromatic system having, e.g., 6 to 60 carbon atoms. Non-limiting examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group and an ovalenyl group.

In the present specification, the heteroaryl group may include, as a hetero atom, at least one of B, O, N, P, Si, or S. When the heteroaryl group includes two or more hetero atoms, the two or more hetero atoms may be the same as or different from each other. The heteroaryl group may be a monocyclic heterocyclic group or a polycyclic heterocyclic group. The number of ring-forming carbon atoms in the heterocyclic group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxy group, a phthalazine group, a pyrido pyrimidine group, a pyrido pyrazine group, a pyrazino pyrazine group, an isoquinoline group, an indole group, a carbazole group, an N-aryl carbazole group, an N-heteroaryl carbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilol group, a dibenzofuran group, and the like, but the present disclosure is not limited thereto.

In the present specification, the above description regarding the aryl group may be applied to an arylene group except that the arylene group is a divalent group. The above description regarding the heteroaryl group may be applied to a heteroarylene group except that the heteroarylene group is a divalent group.

In the present specification, the number of carbon atoms of an amine group is not particularly limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, and a triphenylamine group, but the present disclosure is not limited thereto.

In the present specification, a direct linkage may refer to a single bond.

Hereinafter, a light-emitting element, a display device including the same, and a manufacturing method of the light-emitting element according to one or more embodiments will be described with reference to the accompanying drawings.

Figure 2:
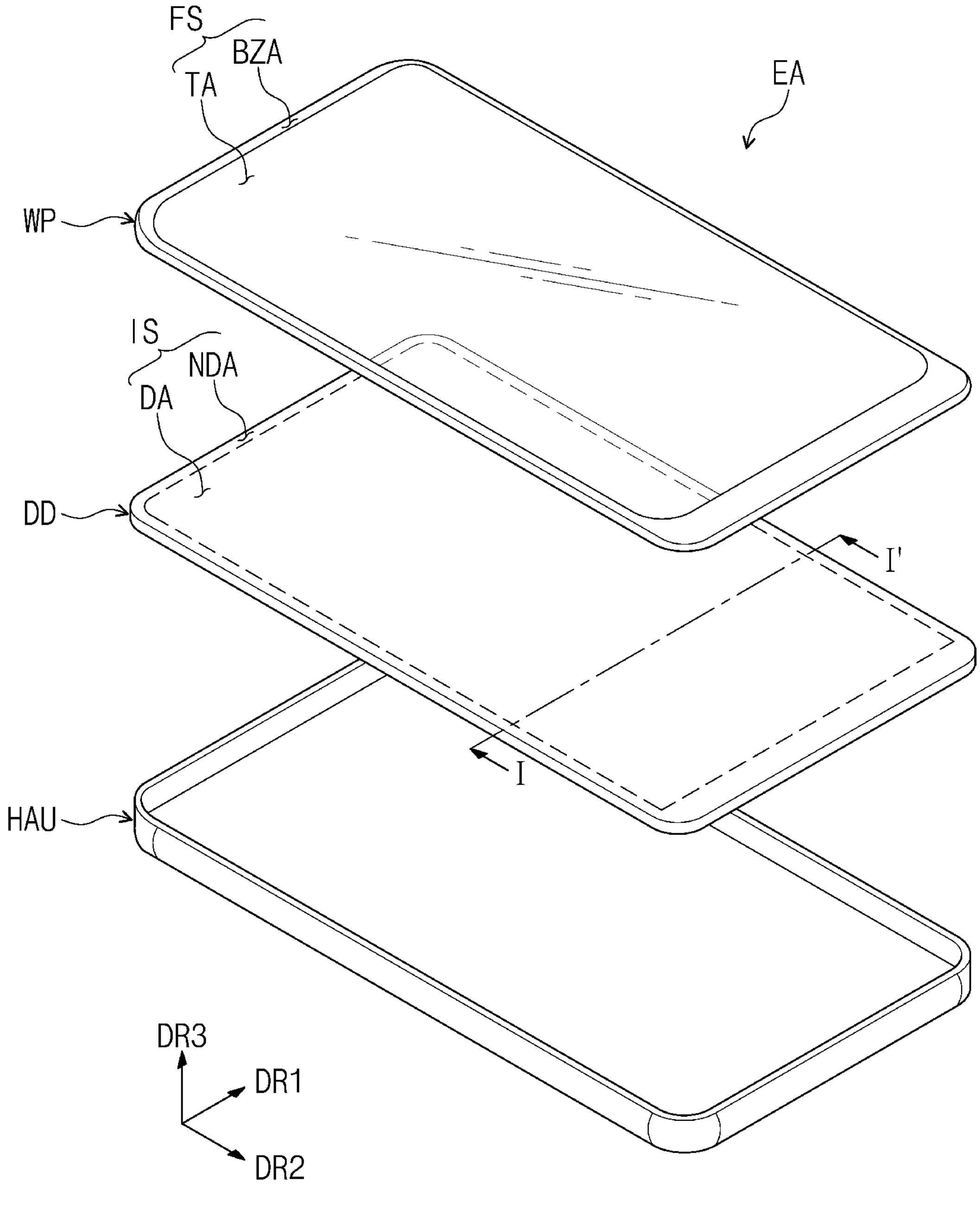
FIG. 2 is an exploded perspective view of an electronic device according to an embodiment.

FIG. 1 is a perspective view illustrating an electronic device according to an embodiment. FIG. 2 is an exploded perspective view of an electronic device according to an embodiment.

Referring to FIGS. 1 and 2, in an embodiment, an electronic device EA may be a large electronic device such as a television, a monitor, and/or an external billboard. In addition, the electronic device EA may be a small- and/or medium-sized electronic device such as a personal computer, a notebook computer, a personal digital terminal, a car navigation unit, a game machine, a smartphone, a tablet computer, and/or a camera. In addition, these are presented only as examples, so that the electronic device EA may employ (e.g., may be) other electronic devices without departing from the subject matter of the present disclosure. In an embodiment, as an example, the electronic device EA is illustrated as a smartphone.

The electronic device EA may include a display device DD and a housing HAU. The display device DD may display an image IM through a display surface IS. FIG. 1 illustrates that the display surface IS is parallel to a plane defined by a first direction DR1 and a second direction DR2 intersecting the first direction DR1. However, this is an example, and in another embodiment, the display surface IS of the display device DD may have a curved shape.

Along the normal direction of the display surface IS, that is, the thickness direction of the electronic device EA, a direction in which the image IM is displayed is indicated by a third direction DR3. A front surface (or an upper surface) and a rear surface (or a lower surface) of each member may be defined by the third direction DR3. Meanwhile, the directions indicated by the first to third directions DR1, DR2, and DR3 are relative concepts and may be converted to other directions.

The display surface IS on which the image IM is displayed in the electronic device EA may correspond to a front surface of the display device DD, and may correspond to a front surface FS of a window WP. Hereinafter, the display surface, the front surface of the electronic device EA, and the front surface of the window WP are denoted with the same reference numeral (e.g., same reference letters FS). The image IM may include a dynamic image as well as a still image. In one or more embodiments, the electronic device EA may include a foldable display device including a folding region and a non-folding region, and/or a bendable display device including at least one bendable part.

The housing HAU may accommodate the display device DD. The housing HAU may be disposed to cover the display device DD such that an upper surface of the display device DD, which is the display surface IS, is exposed. The housing HAU covers a side surface and a bottom surface of the display device DD, and may expose an entire upper surface of the display device DD. However, the present disclosure is not limited thereto, and the housing HAU may cover not only the side surface and the bottom surface of the display device DD, but also a part of the upper surface.

In the electronic device EA according to an embodiment, the window WP may include an optically transparent insulating material. The window WP may include a transmission region TA and a bezel region BZA. The front surface FS of the window WP including the transmission region TA and the bezel region BZA corresponds to the front surface FS of the electronic device EA. A user may visually recognize an image provided through the transmission region TA corresponding to the front surface FS of the electronic device EA.

FIGS. 1 and 2 illustrate that the transmission region TA has a rectangular shape with rounded vertices, but this is illustrated as an example. Thus, the transmission region TA may have various suitable shapes, and the present disclosure is not limited to any one example.

The transmission region TA may be an optical transmission (e.g., optically transmissive) region. The bezel region BZA may have a relatively low light transmittance compared to that of the transmission region TA. The bezel region BZA may have a set or predetermined color. The bezel region BZA is adjacent to the transmission region TA and may surround (may be around) the transmission region TA. The bezel region BZA may define the shape of the transmission region TA. However, the present disclosure is not limited to the illustrated embodiment, and the bezel region BZA may be disposed adjacent to only one side of the transmission region TA, and/or a portion of the bezel region BZA may be omitted.

The display device DD may be disposed below the window WP. In the present specification, the term “below” as used herein may refer to a direction opposite to a direction in which the display device DD provides an image.

In an embodiment, the display device DD may have a configuration that substantially generates an image IM. The image IM generated by the display device DD is displayed on the display surface IS, and is visually recognized by a user from the outside through the transmission region TA. The display device DD includes a display region DA and a non-display region NDA. The display region DA may be a region that is activated in response to an electrical signal. The non-display region NDA may be a region covered by the bezel region BZA. The non-display region NDA is adjacent to the display region DA. The non-display region NDA may surround (may be around) the display region DA.

The display device DD may include a display panel DP and a light control layer PP disposed on the display panel DP. The display panel DP may include a display element layer DP-EL. The display element layer DP-EL includes a light-emitting element ED.

Figure 8:
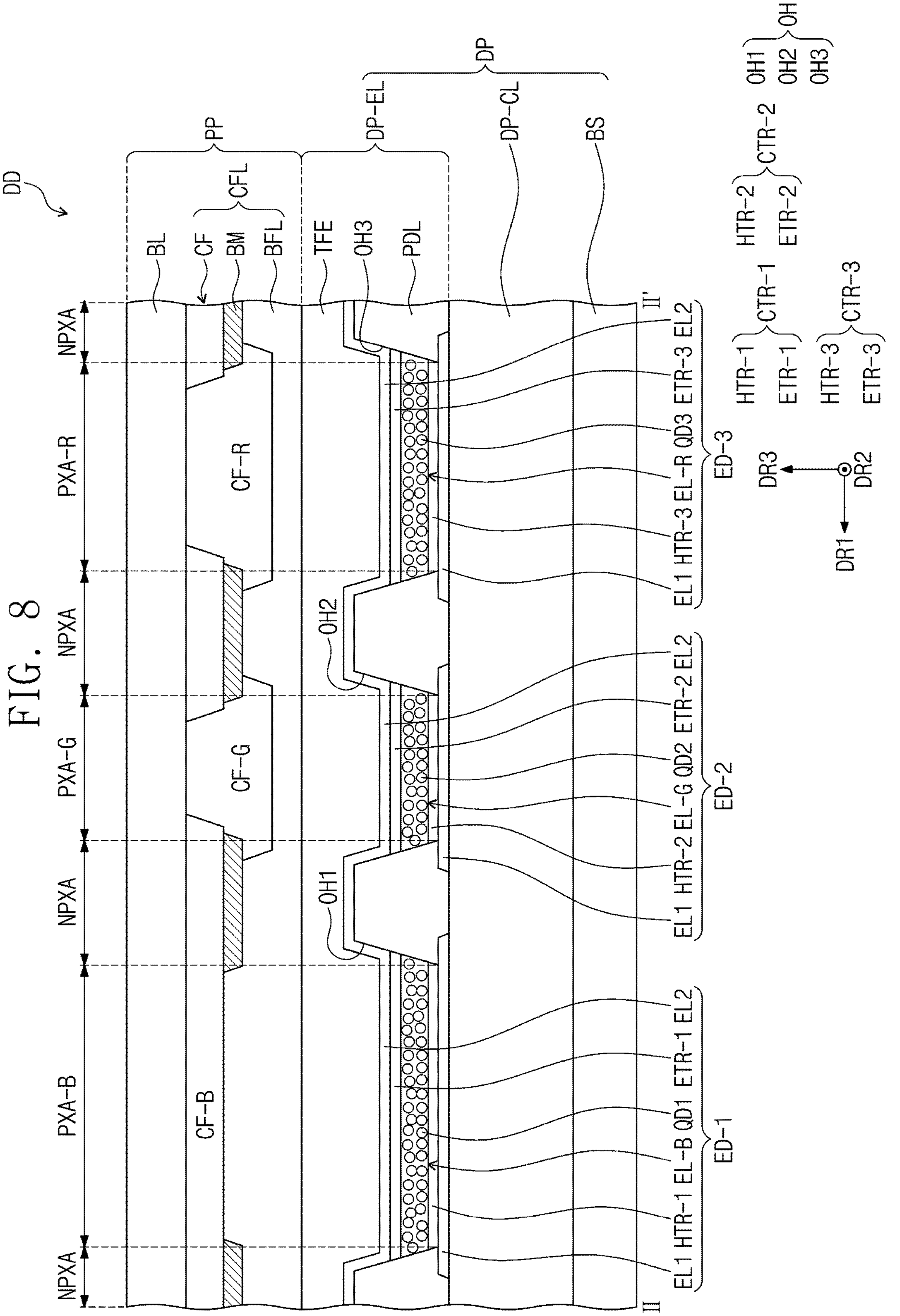
FIG. 8 is a cross-sectional view of a display device according to an embodiment.

The display device DD may include a plurality of light-emitting elements ED-1, ED-2, and ED-3 (see FIG. 8). The light control layer PP may be disposed on the display panel DP to control reflected light of external light at the display panel DP. For example, the light control layer PP may include a polarizing layer and/or a color filter layer.

In the display device DD of an embodiment, the display panel DP may be a light-emitting display panel. For example, the display panel DP may be a quantum dot light-emitting display panel including a quantum dot light-emitting element. However, the present disclosure is not limited thereto.

The display panel DP may include a base substrate BS, a circuit layer DP-CL disposed on the base substrate BS, and a display element layer DP-EL disposed on the circuit layer DP-CL.

The base substrate BS may be a member that provides a base surface on which the display element layer DP-EL is disposed. The base substrate BS may be a glass substrate, a metal substrate, a plastic substrate, and/or the like. However, the present disclosure is not limited thereto, and the base substrate BS may be an inorganic layer, an organic layer, or a composite material (e.g., including an organic material and an inorganic material) layer. The base substrate BS may be a flexible substrate that may be easily bendable and/or foldable.

In an embodiment, the circuit layer DP-CL may be disposed on the base substrate BS, and the circuit layer DP-CL may include a plurality of transistors. The transistors may each include a control electrode, an input electrode, and an output electrode. For example, the circuit layer DP-CL may include a switching transistor and a driving transistor for driving the light-emitting element ED of the display element layer DP-EL.

Figure 3:
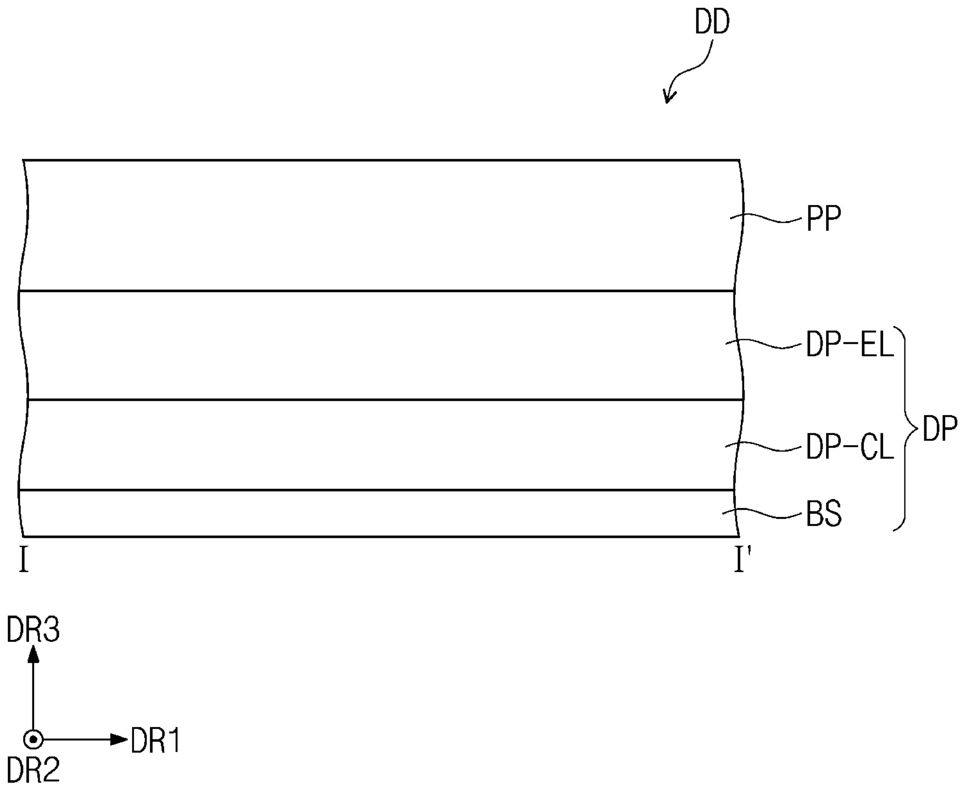
FIG. 3 is a cross-sectional view of a display device according to an embodiment.
Figure 4:
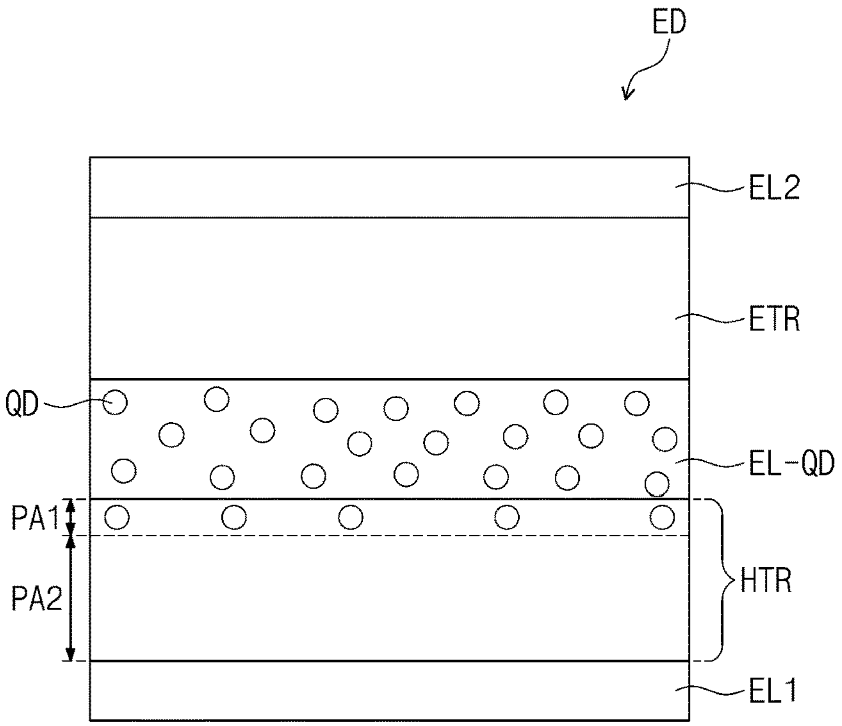
FIG. 4 is a cross-sectional view of a light-emitting element according to an embodiment.
Figure 5:
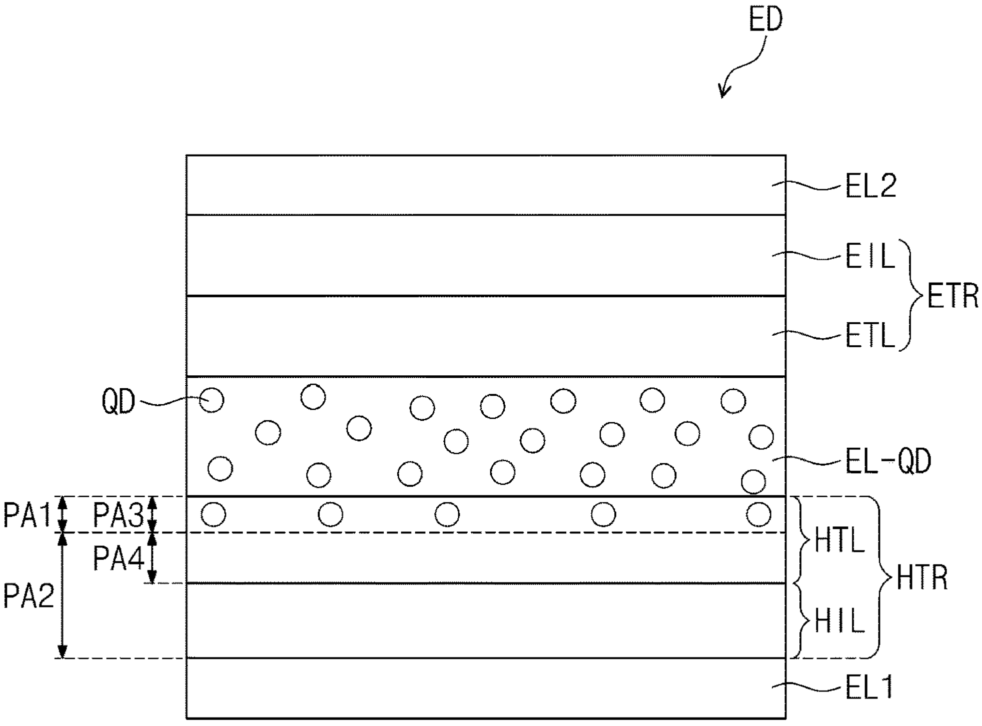
FIG. 5 is a cross-sectional view of a light-emitting element according to an embodiment.
Figure 6:
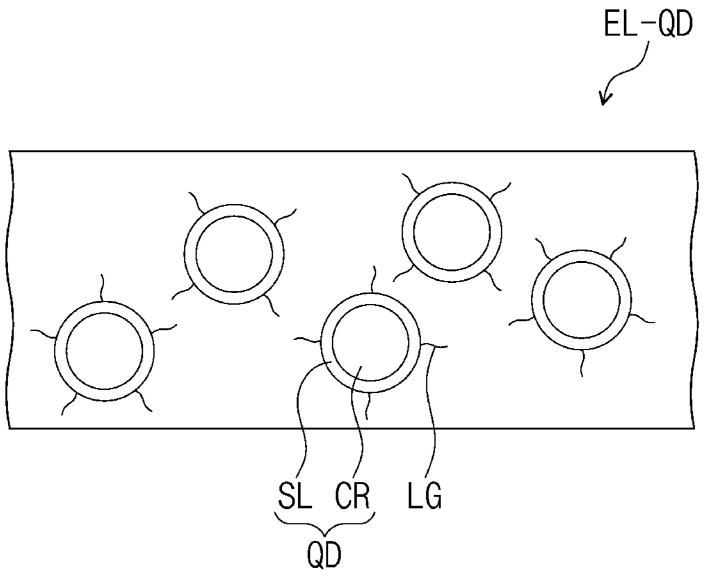
FIG. 6 is a cross-sectional view illustrating a part of a light-emitting element according to an embodiment.

FIG. 3 is a cross-sectional view of a display device according to an embodiment. In particular, FIG. 3 is a cross-sectional view of the display device of the embodiment of FIG. 2 taken along the line I-I'. FIG. 4 is a cross-sectional view of a light-emitting element according to an embodiment. FIG. 5 is a cross-sectional view of a light-emitting element according to an embodiment. FIG. 6 is a cross-sectional view illustrating a part of a light-emitting element according to an embodiment.

Referring to FIGS. 3 to 6, the light-emitting element ED according to an embodiment includes a first electrode EL1, a second electrode EL2 facing the first electrode EL1, and a plurality of functional layers disposed between the first electrode EL1 and the second electrode EL2 and including a light-emitting layer EL-QD.

The plurality of functional layers may include a hole transport region HTR disposed between the first electrode EL1 and the light-emitting layer EL-QD and an electron transport region ETR disposed between the light-emitting layer EL-QD and the second electrode EL2. In one or more embodiments, a capping layer may be further disposed on the second electrode EL2.

In the light-emitting element ED according to an embodiment, the first electrode EL1 has electrical conductivity. The first electrode EL1 may be formed of a metal alloy and/or a conductive compound. The first electrode EU may be an anode. The first electrode EL1 may be a pixel electrode.

In the light-emitting element ED according to the embodiment, the first electrode EL1 may be a reflective electrode. However, the present disclosure is not limited thereto. For example, the first electrode EL1 may be a transmissive electrode, a transflective electrode, and/or the like. When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In some embodiments, the first electrode EL1 may have a multilayer structure including a reflective film or a semi-transmissive film formed of the above-described materials, and a transparent conductive film formed of indium tin oxide (ITO), indium zinc oxide (IZO), zinc oxide (ZnO), indium tin zinc oxide (ITZO), and/or the like. For example, the first electrode EL1 may have a three-layer structure of ITO/Ag/ITO, but the present disclosure is not limited thereto. In some embodiments, the first electrode EL1 may include at least one of the metal materials described above, a combination of two or more kinds of the metal materials selected from the metal materials described above, one or more oxides of the metal materials described above, and/or the like. The thickness of the first electrode EL1 may be about 700 Å to about 10,000 Å. For example, the thickness of the first electrode EL1 may be about 1,000 Å to about 3,000 Å.

The light-emitting layer EL-QD is provided on the first electrode EL1. In the light-emitting element ED according to an embodiment, the light-emitting layer EL-QD may include quantum dots QD. The quantum dots QD may each include a ligand LG on the surface thereof. The ligand LG may increase the dispersibility of the quantum dots QD. However, this is only an example, and the present disclosure is not limited thereto. In some embodiments, the quantum dots QD may have a structure having no ligand LG on the surface thereof. In the light-emitting element ED according to an embodiment, the light-emitting layer EL-QD may be formed from a quantum dot composition QDS (FIG. 11) including the quantum dots QD and an organic solvent SV (FIG. 11) of an embodiment.

The light-emitting layer EL-QD includes a plurality of quantum dots QD. The quantum dots QD included in the light-emitting layer EL-QD may be stacked to form a layer. FIG. 4 is an example that illustrates that circular quantum dots QD are arranged in a cross section to form approximately three layers, but the present disclosure is not limited thereto. For example, the arrangement of quantum dots QD may vary depending on the thickness of the light-emitting layer EL-QD, the shape of the quantum dots QD included in the light-emitting layer EL-QD, the average diameter of the quantum dots QD, and/or the like. For example, the quantum dots QD in the light-emitting layer EL-QD may be aligned to be adjacent to each other to form one layer, to form two layers, or to form four or more layers.

The light-emitting layer EL-QD may have a thickness of, for example, about 5 nm to about 20 nm, or about 10 nm to about 20 nm.

The quantum dots QD included in the light-emitting layer EL-QD of an embodiment may be selected from among a Group II-VI compound, a Group III-V compound, a Group III-VI compound, a Group compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof.

The Group III-VI compound may include a binary compound such as $In_2S_3$ and/or $In_2Se_3$; a ternary compound such as $InGaS_3$ and/or $InGaSe_3$; or any combination thereof.

The Group compound may be selected from a ternary compound such as AgInS, $AgInS_2$, CuInS, $CuInS_2$, $AgGaS_2$, $CuGaS_2$ $CuGaO_2$, $AgGaO_2$, $AgAlO_2$ and mixtures thereof, and a quaternary compound such as $AgInGaS_2$, and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof. In one or more embodiments, the Group III-V compound may further include a Group II metal. For example, InZnP and/or the like may be selected as the Group V compound.

The Group IV-VI compound may be selected from the group consisting of a binary compound selected from the group consisting of SnS, SnSe, SnTe, PbS, PbSe, PbTe and a mixture thereof, a ternary compound selected from the group consisting of SnSeS, SnSeTe, SnSTe, PbSeS, PbSeTe, PbSTe, SnPbS, SnPbSe, SnPbTe and a mixture thereof, and a quaternary compound selected from the group consisting of SnPbSSe, SnPbSeTe, SnPbSTe and a mixture thereof. The Group IV element may be selected from the group consisting of Si, Ge, and mixtures thereof. The Group IV compound may be a binary compound selected from the group consisting of SiC, SiGe, and a mixture thereof.

In this case, the binary compound, the ternary compound, and/or the quaternary compound may be present in the particle with a uniform concentration, or may be present in the same particle with partially different concentrations.

In some embodiments, the quantum dots QD may have a core-shell structure including the core CR containing the above-described nanocrystal and the shell SL surrounding the core CR. The shell SL of the quantum dot QD may serve as a protective layer to maintain semiconductor characteristics by preventing or reducing chemical modification of the core CR and/or serve as a charging layer to impart electrophoretic characteristics to the quantum dot QD. The shell SL may be a single layer or a plurality of layers. Examples of the shell SL of the quantum dot QD may include a metal oxide, a non-metal oxide, a semiconductor compound, or a combination thereof.

For example, the metal oxide and/or the non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as $MgAl_2O_4$, $CoFe_2O_4$, $NiFe_2O_4$, and/or $CoMn_2O_4$, but the present disclosure is not limited thereto.

In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InGaP, InSb, AlAs, AlP, AlSb, and/or the like, but the present disclosure is not limited thereto.

The interface between the core CR and the shell SL may have a concentration gradient in which the concentration of an element present in the shell SL decreases toward the center of the core.

The quantum dots QD may have a full width of half maximum FWHM of an emission wavelength spectrum of about 45 nm or less, for example, about 40 nm or less, or about 30 nm or less, and within these ranges, the color purity or the color reproducibility may be improved. In addition, light emitted through these quantum dots may be emitted in all directions, so that wide viewing angle characteristics may be improved.

In addition, the shape of the quantum dots QD is not particularly limited to a shape commonly utilized in the field. For example, the quantum dots QD may have a shape such as a spherical shape, a pyramidal shape, a multi-arm shape, a cubic nanoparticle, a nanotube, a nanowire, a nanofiber, and/or a nanoplatelet particle.

The quantum dots QD may control the color of emitted light according to the particle size, and accordingly, the quantum dots QD may have various suitable emission colors such as blue, red, and/or green.

The quantum dots may emit light in a shorter wavelength range as the particle size of the quantum dots QD becomes (e.g., is) smaller. For example, in the quantum dots QD having the same core CR, the particle size of the quantum dot that emits green light may be smaller than the particle size of the quantum dot that emits red light. In addition, in the quantum dots QD having the same core CR, the particle size of the quantum dot that emits blue light may be smaller than the particle size of the quantum dot that emits green light. However, the present disclosure is not limited thereto, and the particle size may be adjusted according to a shell SL forming material and a shell SL thickness even in the quantum dots QD having the same core CR.

In one or more embodiments, when the quantum dots QD have various suitable emission colors such as blue, red, and/or green, the quantum dots QD having different emission colors may have different core CR materials.

In the light-emitting element ED according to an embodiment, the light-emitting layer EL-QD may include a host and a dopant. In an embodiment, the light-emitting layer EL-QD may include the quantum dots QD as a dopant material. In addition, in an embodiment, the light-emitting layer EL-QD may further include a host material.

In one or more embodiments, in the light-emitting element ED according to an embodiment, the light-emitting layer EL-QD may emit fluorescence. For example, the quantum dots QD may be utilized as a fluorescent dopant material.

The light-emitting layer EL-QD may be formed utilizing various suitable methods such as a vacuum evaporation method, a spin coating method, a cast method, a LB method (Langmuir-Blodgett), an inkjet printing method, a laser printing method, and/or a laser induced thermal imaging (LITI). For example, the light-emitting layer EL-QD may be formed by providing the quantum dot composition of an embodiment utilizing the inkjet printing method.

The hole transport region HTR is provided between the first electrode EU and the light-emitting layer EL-QD. The hole transport region HTR may include a hole transport material. The hole transport region HTR may function to inject holes into the light-emitting layer EL-QD.

In an embodiment, the hole transport region HTR may include quantum dots QD in a portion adjacent to the light-emitting layer EL-QD. The hole transport region HTR may be divided into a first portion PA1 that contains the quantum dots QD and a second portion PA2 that does not contain the quantum dots QD. The first portion PA1 may be adjacent to and closer to the light-emitting layer EL-QD than the second portion PA2.

The quantum dots QD of the hole transport region HTR may be the quantum dots QD of the light-emitting layer EL-QD (e.g., a least some of the quantum dots QD of the light-emitting layer EL-QD) that diffused into the hole transport region HTR. The quantum dots QD of the hole transport region HTR may be formed by diffusion of (e.g., a portion of) the quantum dots QD of the light-emitting layer EL-QD into the hole transport region HTR in the heat-treating (e.g., the heat treatment process) (S520, FIG. 9B) of a manufacturing method of a light-emitting element ED according to an embodiment.

In an embodiment, the hole transport region HTR may include a plurality of organic layers. An organic layer most adjacent to the light-emitting layer EL-QD from among the plurality of organic layers of the hole transport region HTR may include the quantum dots QD.

In an embodiment, the plurality of organic layers may include a hole injection layer HIL and a hole transport layer HTL. The hole injection layer HIL may be disposed on the first electrode EL1, and the hole transport layer HTL may be disposed on the hole injection layer HIL. The hole transport layer HTL may be disposed adjacent to the light-emitting layer EL-QD rather than the hole injection layer HIL. That is, the hole transport layer HTL may be disposed closer to the light-emitting layer EL-QD than the hole injection layer HIL. The hole transport layer HTL may include the quantum dots QD.

In an embodiment, the hole transport layer HTL may be divided into a third portion PA3 that contains the quantum dots QD and a fourth portion PA4 that does not contain the quantum dots. The third portion PA3 may be a portion adjacent to and closer to the light-emitting layer EL-QD than the fourth portion PA4. The thickness of the third portion PA3 may be smaller than the thickness of the fourth portion PA4. The thickness of the third portion PA3 may be 10% or less of the total thickness of the hole transport layer HTL.

In the third portion PA3, the distribution density of the quantum dots QD in the portion adjacent to the light-emitting layer EL-QD may be greater than the distribution density of the quantum dots QD in the portion adjacent to the fourth portion PA4. The distribution density of the quantum dots QD may decrease from the third portion PA3 to the fourth portion PA4. That is, the third portion PA3 may have a concentration gradient from a portion adjacent to the light-emitting layer EL-QD to a portion adjacent to the fourth portion PA4.

When the energy level difference between a material included in the hole transport region HTR and a material of the light-emitting layer EL-QD is large, injection of holes into the light-emitting layer EL-QD may not proceed smoothly. In an embodiment, the hole transport region HTR includes the quantum dots QD in a portion adjacent to the light-emitting layer EL-QD, so that the injection of the holes may be smoothly performed due to the effect of an energy level gradient between the hole transport region HTR and the light-emitting layer EL-QD.

In some embodiments the hole transport region HTR may further include at least one of a hole buffer layer or an electron blocking layer, in addition to the hole injection layer HIL and the hole transport layer HTL. The hole buffer layer may increase luminous efficiency by compensating for a resonance distance according to the wavelength of light emitted from the light-emitting layer EL-QD. A material that may be included in the hole transport region HTR may be utilized as a material included in the hole buffer layer. The electron blocking layer is a layer that prevents or reduces injection of electrons from the electron transport region ETR to the hole transport region HTR.

The hole transport region HTR may have a single layer formed of a single material, a single layer formed of a plurality of different materials, or a multilayer structure having a plurality of layers formed of a plurality of different materials. For example, the hole transport region HTR may have a structure of a single layer formed of a plurality of different materials, or may have a structure such as hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, in which the constituting layers are sequentially stacked from the first electrode EL1 in the respective stated order, but the present disclosure is not limited thereto.

The hole transport region HTR may include a compound represented by Formula H-1 below.

Formula H-1

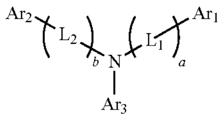

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. a and b may each independently be an integer of 0 to 10. Meanwhile, when a or b is an integer of 2 or more, a plurality of $L_1$(s) and $L_2$(s) may each independently be a substituted or unsubstituted arylene group having 6 to 30 ring-forming carbon atoms, or may each independently be a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In addition, $Ar_3$ in Formula H-1 may be a substituted or unsubstituted aryl group having 6 to 30 ring-forming carbon atoms.

The compound represented by Formula H-1 may be a monoamine compound. In some embodiments, the compound represented by Formula H-1 may be a diamine compound in which one or at least one of $Ar_1$ to $Ar_3$ contains an amine group as a substituent. In addition, the compound represented by Formula H-1 may be a carbazole-based compound containing a substituted or unsubstituted carbazole group in at least one of $Ar_1$ or $Ar_2$, or a fluorene-based compound containing a substituted or unsubstituted fluorene group in at least one of $Ar_1$ or $Ar_2$.

The compound represented by Formula H-1 may be represented by any one of the compounds of the following Compound group H. However, the compounds listed in the following Compound group H are examples, and the compound represented by the Formula H-1 is not limited to the ones illustrated in Compound group H below.

Compound group H

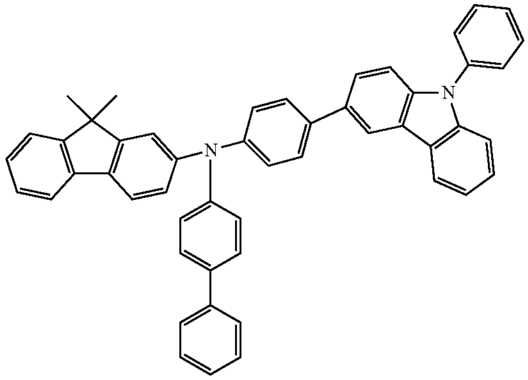

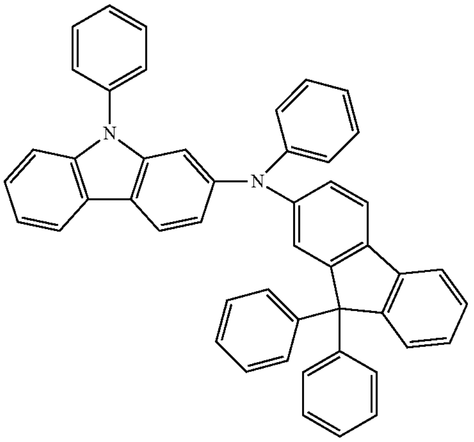

-continued
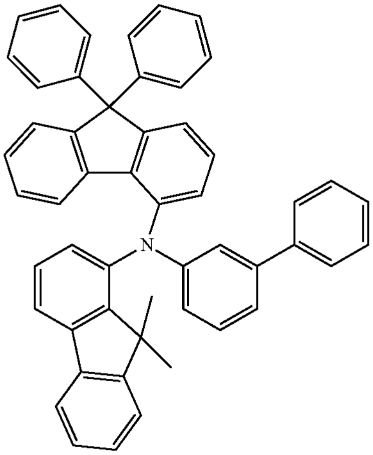
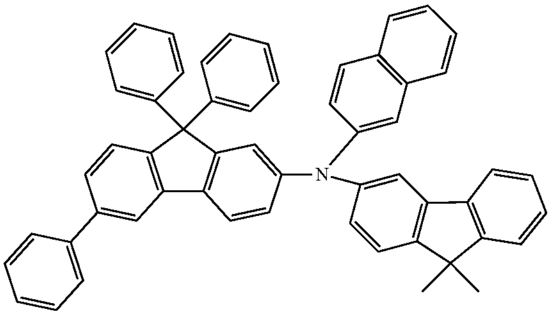
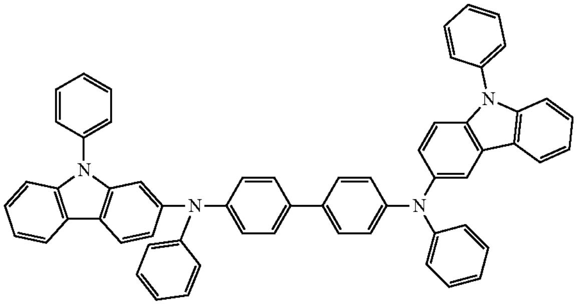
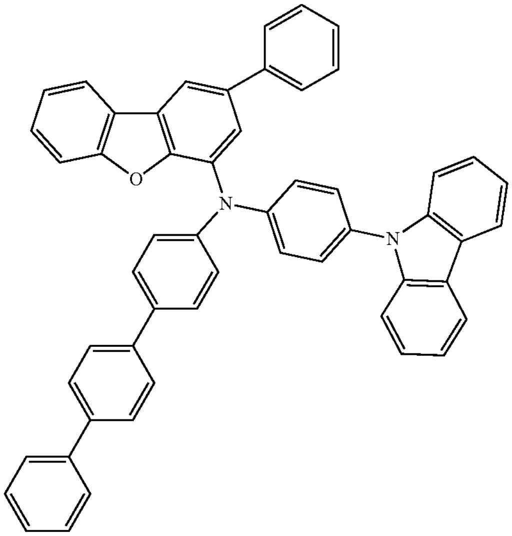
-continued
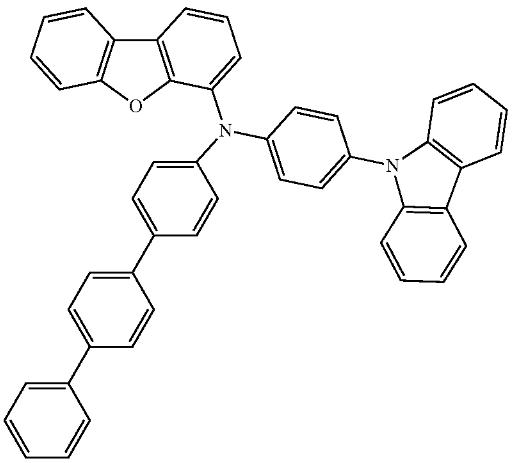
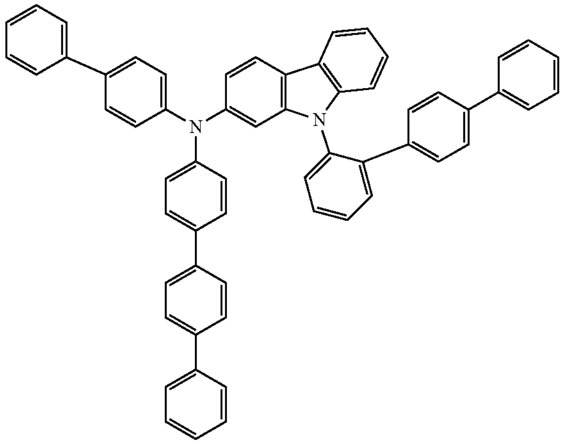
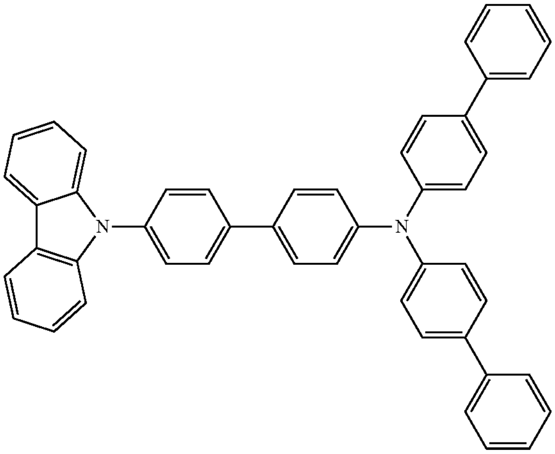

-continued
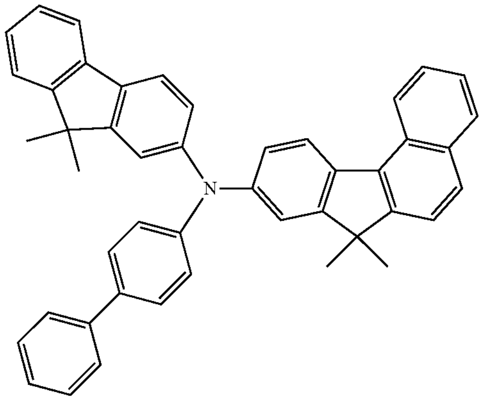
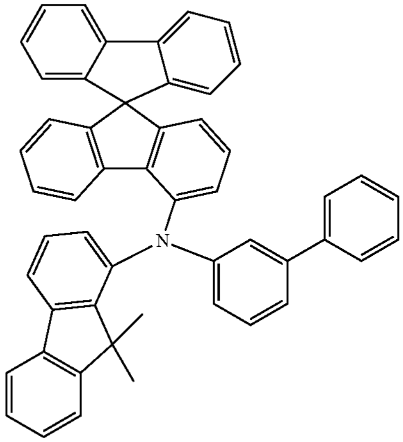
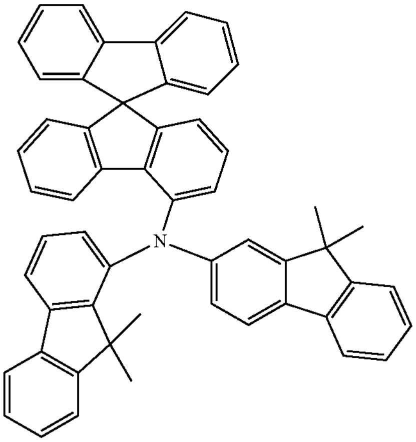
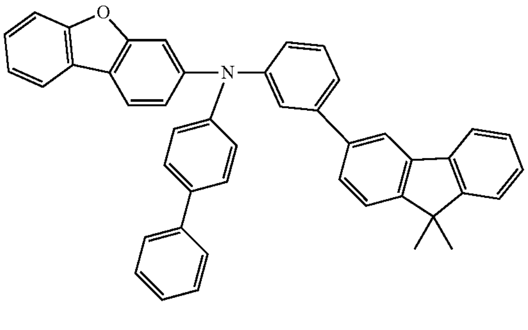
-continued
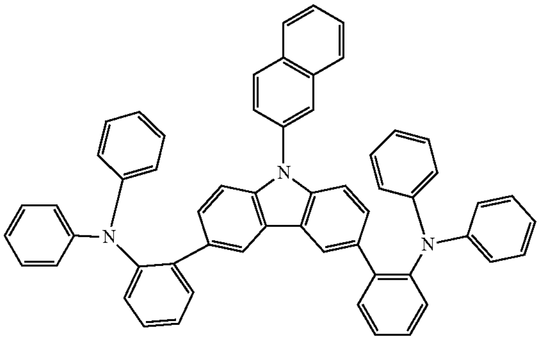
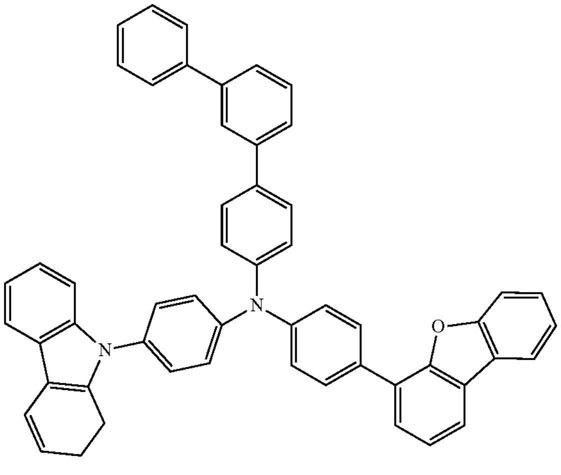
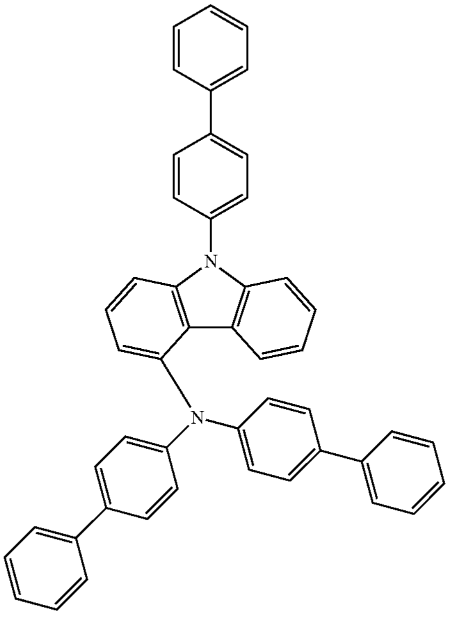

-continued

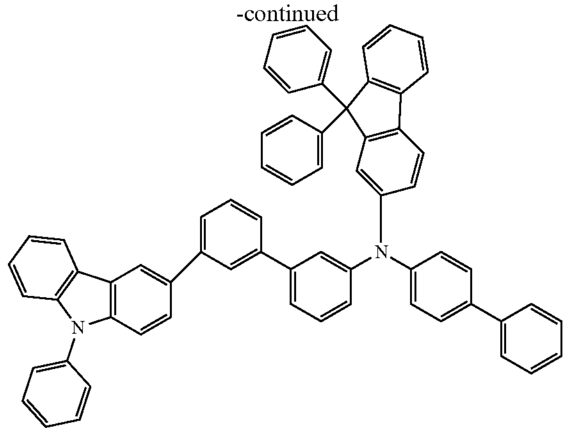

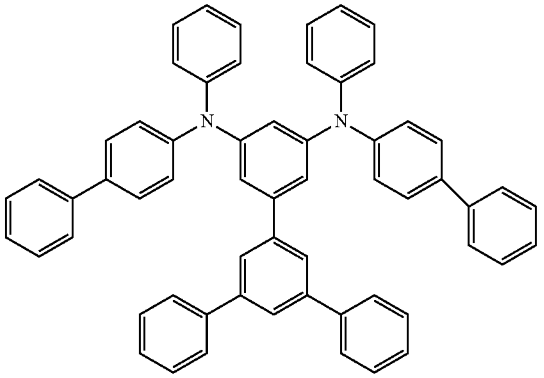

The hole transport layer HTR may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), (polyaniline)/poly(4-styrenesulfonate) (PANI/PSS), N,N'-di(naphthalene-1-yl)-N,N'-diphenyl-benzidine (NPB), polyetherketone containing triphenylamine (TPAPEK), 4-isopropyl-4'-methyldiphenyliodonium tetrakis(pentafluorophenyl)borate], dipyrazino[2,3-f:2',3'-h]quinoxaline-2,3,6,7,10,11-hexacarbonitrile (HATCN), and/or the like.

The hole transport region HTR may include a carbazole-based derivative such as N-phenylcarbazole and/or polyvinylcarbazole, a fluorine-based derivative, a triphenylamine-based derivative such as N,N'-bis(3-methylphenyl)-N,N'-diphenyl-[1,1-biphenyl]-4,4'-diamine (TPD) and/or 4,4',4"-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-Bis(N-carbazolyl)benzene (mCP), and/or the like.

In addition, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), and/or the like.

The hole transport region HTR may include the compounds of the hole transport region described above in at least one of the hole injection layer HIL, the hole transport layer HTL, or the electron blocking layer EBL.

In the light-emitting element ED of an embodiment, the electron transport region ETR is provided on the light-emitting layer EL-QD. The electron transport region ETR may not include the quantum dots QD. The electron transport region ETR may include at least one of a hole blocking layer, an electron transport layer ETL, or an electron injection layer EIL, but the present disclosure is not limited thereto.

The electron transport region ETR may have a single layer formed of a single material, a single layer formed of a plurality of different materials, or a multilayer structure having a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In one or more embodiments, the electron transport region ETR may have a structure of single layers formed of a plurality of different materials, or may have a structure such as electron transport layer ETL/electron injection layer EIL, or hole blocking layer/electron transport layer ETL/electron injection layer EIL, in which constituting layers are sequentially stacked from the light-emitting layer EL-QD in the respective stated order, but the present disclosure is not limited thereto. The thickness of the electron transport region ETR may be, for example, about 200 Å to about 1,500 Å.

The electron transport region ETR may include a compound represented by Formula ET-1 below.

Formula ET-1

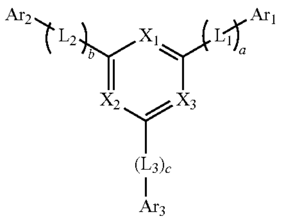

In Formula ET-1, at least one of $X_1$ to $X_3$ is N and the others (e.g., a remainder thereof) are each $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer of 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a to c are each an integer of 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), or a mixture (e.g., a combination) thereof.

In addition, the electron transport region ETR may include a metal halide such as LiF, NaCl, CsF, RbCl, RbI, CuI, and/or KI; a lanthanum group metal such as Yb; and/or a co-deposition material of the above-described metal halide and the lanthanum group metal. For example, the electron transport region ETR may include KI:Yb, RbI:Yb, and/or the like as a co-deposition material. In some embodiments, the electron transport region ETR may include a metal oxide such as $Li_2O$ and/or BaO, 8-hydroxyl-lithium quinolate (Liq), and/or the like, but the present disclosure is not limited thereto. In addition, the electron transport region ETR may be formed of a material in which an electron transport material and an insulating organometallic salt are mixed. The organometallic salt may be a material having an energy band gap of approximately 4 eV or more. For example, the organometallic salt may include a metal acetate, a metal benzoate, a metal acetoacetate, a metal acetylacetonate and/or a metal stearate.

The electron transport region ETR may further include at least one of 2,9-dimethyl-4,7-diphenyl-1,10-phenanthroline (BCP) or 4,7-diphenyl-1,10-phenanthroline (Bphen) in addition to the materials described above, but the present disclosure is not limited thereto.

The electron transport region ETR may include the compounds of the electron transport region described above, in at least one of the electron injection layer EIL, the electron transport layer ETL, or the hole blocking layer HBL.

When the electron transport region ETR includes the electron transport layer ETL, the thickness of the electron transport layer ETL may be about 100 Å to about 1,000 Å, for example, about 150 Å to about 500 Å. When the thickness of the electron transport layer ETL satisfies the above-described ranges, a satisfactory electron transport characteristic may be obtained without a substantial increase in driving voltage. When the electron transport region ETR includes the electron injection layer EIL, the thickness of the electron injection layer EIL may be about 1 Å to about 100 Å, or about 3 Å to about 90 Å. When the thickness of the electron injection layer EIL satisfies the above-described ranges, a satisfactory electron injection characteristic may be obtained without a substantial increase in driving voltage.

The second electrode EL2 is provided on the electron transport region ETR. The second electrode EL2 may be a common electrode and/or a negative electrode. The second electrode EL2 may be a transmissive electrode, a transflective electrode, or a reflective electrode. When the second electrode EL2 is the transmissive electrode, the second electrode EL2 may include a transparent metal oxide such as indium tin oxide (ITO), indium zinc oxide (IZO), zinc oxide (ZnO), and/or indium tin zinc oxide (ITZO).

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., a mixture of AgMg, AgYb, and/or MgAg). In some embodiments, the second electrode EL2 may have a multilayer structure including a reflective film or a semi-transmissive film formed of the above-described material and a transparent conductive film formed of indium tin oxide (ITO), indium zinc oxide (IZO), zinc oxide (ZnO), indium tin zinc oxide (ITZO), and/or the like. For example, the second electrode EL2 may include at least one of the metal materials described above, a combination of two or more kinds of the metal materials selected from the above metal materials, and/or one or more oxides of the metal materials described above.

Figure 7:
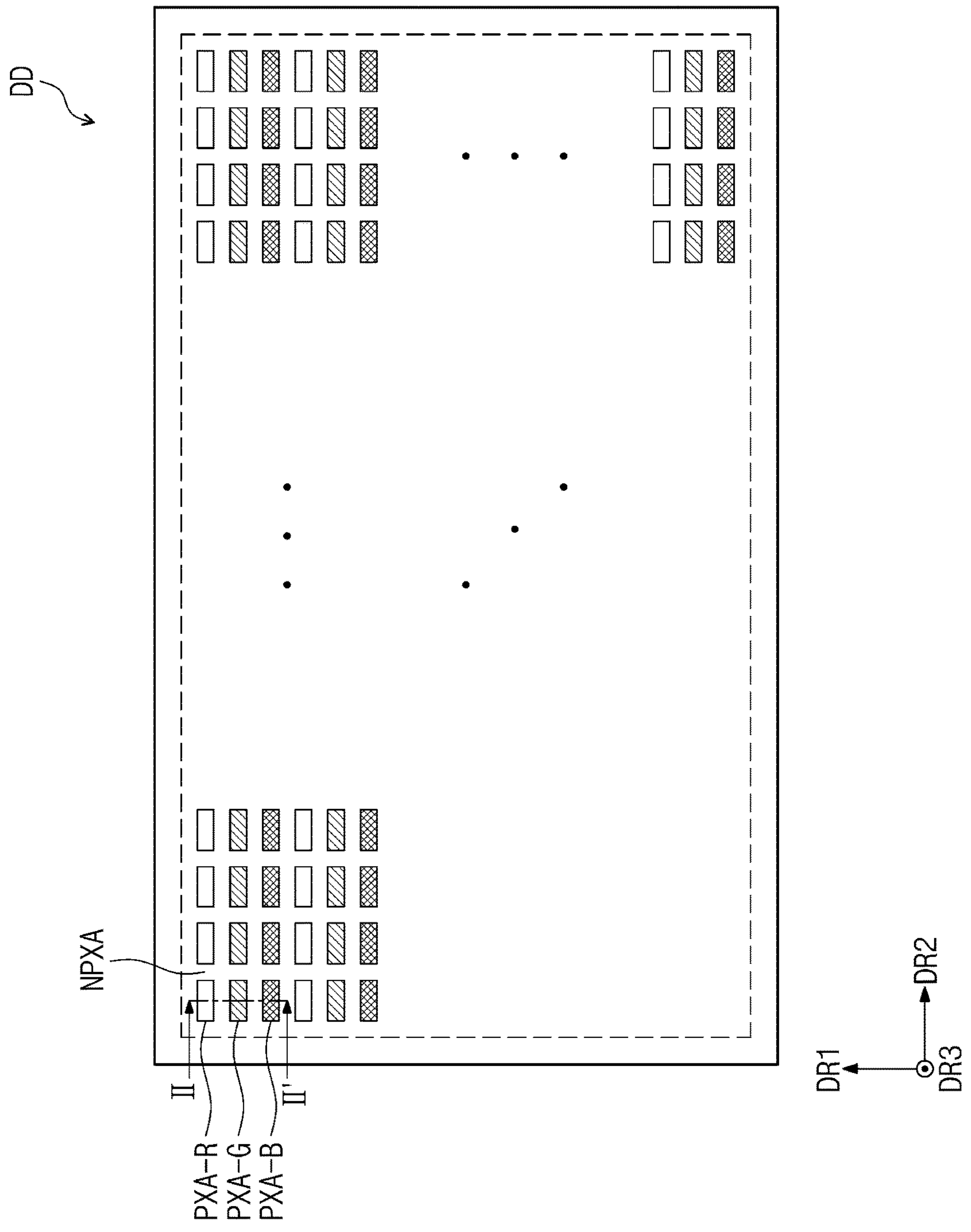
FIG. 7 is a plan view illustrating a display device according to an embodiment.

FIG. 7 is a plan view illustrating a display device according to an embodiment. FIG. 8 is a cross-sectional view of a display device according to an embodiment. In more detail, FIG. 8 is a cross-sectional view taken along the line II-II' of FIG. 7.

Referring to FIG. 7 and FIG. 8, the display device DD according to an embodiment includes a plurality of light-emitting elements ED-1, ED-2, and ED-3, and the light-emitting elements ED-1, ED-2, and ED-3 may respectively include light-emitting layers EL-B, EL-G, and EL-R respectively having quantum dots QD1, QD2, and QD3.

The display panel DP may include a base substrate BS, and a circuit layer DP-CL and a display element layer DP-EL, which are provided on the base substrate BS. The display element layer DP-EL may include pixel defining layers PDL, light-emitting elements ED-1, ED-2, and ED-3 disposed between the pixel defining layers PDL, and an encapsulation layer TFE disposed on the light-emitting elements ED-1, ED-2, and ED-3.

A display device DD may include a non-light-emitting region NPXA and light-emitting regions PXA-B, PXA-G, and PXA-R. The light-emitting regions PXA-B, PXA-G, and PXA-R may be respective regions in which light generated by the light-emitting elements ED-1, ED-2, and ED-3 is respectively emitted. The light-emitting regions PXA-B, PXA-G, and PXA-R may be spaced apart from each other on a plane (e.g., in a plan view).

The light-emitting regions PXA-B, PXA-G, and PXA-R may be divided into a plurality of groups according to the color of light generated from the light-emitting elements ED-1, ED-2, and ED-3. In the display device DD of an embodiment illustrated in FIGS. 7 and 8, three light-emitting regions PXA-B, PXA-G, and PXA-R respectively emitting blue light, green light, and red light are illustrated by way of an example. For example, the display device DD according to an embodiment may include a blue light-emitting region PXA-B, a green light-emitting region PXA-G, and a red light-emitting region PXA-R that are distinguished from each other.

The plurality of light-emitting elements ED-1, ED-2, and ED-3 may emit light of different wavelength ranges. For example, in an embodiment, the display device DD may include a first light-emitting element ED-1 emitting (e.g., to emit) blue light, a second light-emitting element ED-2 emitting (e.g., to emit) green light, and a third light-emitting element ED-3 emitting (e.g., to emit) red light. However, the present disclosure is not limited thereto, and the first to third light-emitting elements ED-1, ED-2, and ED-3 may emit light of the same wavelength range or at least one of the first to third light-emitting elements ED-1, ED-2, or ED-3 may emit light of a different wavelength range.

For example, the blue light-emitting region PXA-B, the green light-emitting region PXA-G, and the red light-emitting region PXA-R of the display device DD may respectively correspond to the first light-emitting element ED-1, the second light-emitting element ED-2, and the third light-emitting element ED-3.

The first light-emitting layer EL-B of the first light-emitting element ED-1 may include a first quantum dot QD1. The first quantum dot QD1 may emit blue light, which is a first light. The second light-emitting layer EL-G of the second light-emitting element ED-2 and the third light-emitting layer EL-R of the third light-emitting element ED-3 may respectively include a second quantum dot QD2 and a third quantum dot QD3. The second quantum dot QD2 and the third quantum dot QD3 may respectively emit green light which is a second light, and red light which is a third light.

Each of the first to third light-emitting layers EL-B, EL-G, and EL-R respectively including the first to third quantum dots QD1, QD2, and QD3 may be formed from a quantum dot composition including the respective quantum dots.

In an embodiment, the first to third quantum dots of the first to third quantum dot QD1, QD2, and QD3 included in the light-emitting elements ED-1, ED-2, and ED-3 may be formed of different core materials. In one or more other embodiments, the first to third quantum dots QD1, QD2, and QD3 may be formed of the same core material, or two quantum dots selected from among the first to third quantum dots QD1, QD2, and QD3 may be formed of the same core material and the rest may be formed of a different core material.

In an embodiment, the first to third quantum dots QD1, QD2, and QD3 may have different diameters. For example, the first quantum dot QD1 utilized in the first light-emitting element ED-1 emitting light in a relatively short wavelength range may have a relatively smaller average diameter than the second quantum dot QD2 of the second light-emitting element ED-2 and the third quantum dot QD3 of the third light-emitting element ED-3, each of which is to emit light in a relatively longer wavelength range. In this specification, the average diameter corresponds to the arithmetic average of the diameters of a plurality of quantum dot particles. In some embodiments, the diameter of the quantum dot particle may be an average value of the width of the quantum dot particles in a cross section.

In the display device DD of an embodiment illustrated in FIGS. 7 and 8, the light-emitting regions PXA-B, PXA-G, and PXA-R may respectively have different areas. In this case, the area may be an area when the light-emitting region is viewed on a plane defined by the first direction DR1 and the second direction DR2 (e.g., in a plan view).

The light-emitting regions PXA-B, PXA-G, and PXA-R may have different areas depending on the colors emitted from the light-emitting layers EL-B, EL-G, and EL-R of the light-emitting element ED-1, ED-2, and ED-3. For example, referring to FIGS. 7 and 8, in the display device DD of an embodiment, the blue light-emitting region PXA-B corresponding to the first light-emitting element ED-1 that emits blue light may have the largest area, and the green light-emitting region corresponding to the second light-emitting element ED-2 that generates green light may have the smallest area. However, the present disclosure is not limited thereto, and the light-emitting regions PXA-B, PXA-G, and PXA-R may emit light of a color other than blue light, green light, and/or red light, the light-emitting regions PXA-B, PXA-G, and PXA-R may have the same area, or the light-emitting regions PXA-B, PXA-G, and PXA-R may be provided at a different area ratio than that illustrated in FIG. 7.

The light-emitting regions PXA-R, PXA-G, and PXA-B may be region respectively divided by a pixel defining layer (or pixel defining layers) PDL. The non-light-emitting regions NPXA may be located between the adjacent light-emitting regions PXA-B, PXA-G, and PXA-R and correspond to the pixel defining layer (or pixel defining layers) PDL. In one or more embodiments, in the present specification, the respective light-emitting regions PXA-B, PXA-G, and PXA-R may each correspond to pixels. The pixel defining layer (or pixel defining layers) PDL may divide (e.g., separate) the light-emitting elements ED-1, ED-2, and ED-3. The light-emitting layers EL-B, EL-G, and EL-R of the light-emitting elements ED-1, ED-2, and ED-3 may be divided (e.g., separate) by being disposed in the openings OH defined by the pixel defining layer (or pixel defining layers) PDL.

The pixel defining layer PDL may be formed of a polymer resin. For example, the pixel defining layer PDL may be formed of a polyacrylate-based resin and/or a polyimide-based resin. In addition, the pixel defining layer PDL may be formed by further including an inorganic material in addition to the polymer resin. In one or more embodiments, the pixel defining layer PDL may be formed by including a light absorbing material, or may be formed by including a black pigment and/or a black dye. The pixel defining layer PDL formed by including a black pigment and/or a black dye may form a black pixel defining layer. Carbon black and/or the like may be utilized as the black pigment and/or the black dye in formation of the pixel defining layer PDL, but the present disclosure is not limited thereto.

In addition, the pixel defining layer PDL may be formed of an inorganic material. For example, the pixel defining layer PDL may be formed by including silicon nitride ($SiN_x$), silicon oxide ($SiO_x$), silicon oxynitride ($SiO_xN_y$), and/or the like. The pixel defining layer PDL may define the light-emitting regions PXA-B, PXA-G, and PXA-R. The light-emitting regions PXA-B, PXA-G, and PXA-R and the non-light-emitting region NPXA may be divided (e.g., defined) by the pixel defining layer (or pixel defining layers) PDL.

Each of the light-emitting elements ED-1, ED-2, and ED-3 may include a first electrode EL1, a hole transport region HTR, light-emitting layers EL-B, EL-G, and EL-R, an electron transport region ETR, and a second electrode EL2.

In the light-emitting elements ED-1, ED-2, and ED-3 included in the display device DD according to an embodiment, the same description, which has been given with reference to FIGS. 1 to 6 and/or the like, may be applied to the first electrode EL1, the hole transport region HTR, the electron transport region ETR, and the second electrode EL2, except that the quantum dots QD1, QD2, and QD3 included in the light-emitting layer EL-B, EL-G, and EL-R may be different from each other.

The encapsulation layer TFE may cover the light-emitting elements ED-1, ED-2, and ED-3. The encapsulation layer TFE may be a single layer or a stack of a plurality of layers. The encapsulation layer TFE may be a thin-film encapsulation layer. The encapsulation layer TFE protects the light-emitting elements ED-1, ED-2, and ED-3. The encapsulation layer TFE may cover the upper surface of the second electrode EL2 disposed in the opening OH and may fill the opening OH.

In one or more embodiments, FIG. 8 illustrates that the hole transport region HTR and the electron transport region ETR are provided as a common layer while covering the pixel defining layer PDL, but the present disclosure is not limited thereto. In an embodiment, the hole transport region HTR and the electron transport region ETR may be disposed in the opening OH defined in the pixel defining layer PDL.

For example, when the hole transport region HTR and the electron transport region ETR as well as the light-emitting layers EL-B, EL-G, and EL-R are provided utilizing an inkjet printing method, the hole transport region HTR, the light-emitting layers EL-B, EL-G, and EL-R, and the electron transport region ETR and/or the like may be provided corresponding to the openings OH defined between the pixel defining layer PDL. However, the present disclosure is not limited thereto, and regardless of a method of providing each functional layer, the hole transport region HTR and the electron transport region ETR may not be patterned but may be provided as one common layer while covering the pixel defining layer PDL, as illustrated in FIG. 8.

In one or more embodiments, in the display device DD of an embodiment illustrated in FIG. 8, all the light-emitting layers EL-B, EL-G, and EL-R of the first to third light-emitting elements ED-1, ED-2, and ED-3 have similar thicknesses, but the present disclosure is not limited thereto. For example, in an embodiment, the thicknesses of the light-emitting layers EL-B, EL-G, and EL-R of the first to third light-emitting elements ED-1, ED-2, and ED-3 may be different from each other.

The light-emitting regions PXA-R, PXA-G, and PXA-B in the display device DD according to an embodiment may be arranged in a stripe shape. Referring to FIG. 7, a plurality of red light-emitting regions PXA-R may be aligned with each other along the second direction axis DR2, a plurality of green light-emitting regions PXA-G may be aligned with each other along the second direction axis DR2, and a plurality of blue light-emitting regions PXA-B may be aligned with each other along the second direction axis DR2. In addition, the light-emitting regions may be arranged alternately in the order of a red light-emitting region PXA-R, a green light-emitting region PXA-G, and a blue light-emitting region PXA-B along the first direction axis DR1.

In one or more embodiments, the arrangement of the light-emitting regions PXA-R, PXA-G, and PXA-B is not limited to that illustrated in FIG. 7, and the arrangement order of the red light-emitting region PXA-R, the green light-emitting region PXA-G, and the blue light-emitting region PXA-B may be provided in various suitable combinations according to the characteristics of display quality required (or desired) for the display device DD. For example, the light-emitting regions PXA-R, PXA-G, and PXA-B may be arranged in a Pentile™ arrangement or a diamond arrangement.

Referring to FIG. 8, the display device DD according to an embodiment may further include a light control layer PP. The light control layer PP may block or reduce external light provided from the outside of the display device DD to the display panel DP. The light control layer PP may block a part of the external light. The light control layer PP may have an anti-reflection function to reduce or minimize reflection by external light.

In an embodiment the light control layer PP may include a color filter layer CFL. That is, the display device DD according to an embodiment may further include a color filter layer CFL disposed on the light-emitting elements ED-1, ED-2, and ED-3 of the display panel DP.

In the display device DD of an embodiment, the light control layer PP may include a base layer BL and a color filter layer CFL.

The base layer BL may be a member that provides a base surface on which the color filter layer CFL and/or the like is disposed. The base layer BL may be a glass substrate, a metal substrate, a plastic substrate, and/or the like. However, the present disclosure is not limited thereto, and the base layer BL may be an inorganic layer, an organic layer, or a composite material layer.

The color filter layer CFL may include a light blocking portion BM and a color filter portion CF. The color filter portion CF may include a plurality of filters CF-B, CF-G, and CF-R. That is, the color filter layer CFL may include a first filter CF-B transmitting a first light, a second filter CF-G transmitting a second light, and a third filter CF-R transmitting a third light. For example, the first filter CF-B may be a blue filter, the second filter CF-G may be a green filter, and the third filter CF-R may be a red filter.

Each of the filters CF-B, CF-G, and CF-R may contain a polymer photosensitive resin and a pigment and/or a dye. The first filter CF-B may contain a blue pigment and/or dye, the second filter CF-G may contain a green pigment and/or dye, and the third filter CF-R may contain a red pigment and/or dye.

However, the present disclosure is not limited thereto, and the first filter CF-B may not contain a pigment and/or a dye. The first filter CF-B may contain a polymer photosensitive resin and may not contain a pigment and/or a dye. The first filter CF-B may be transparent. The first filter CF-B may be formed of a transparent photosensitive resin.

The light blocking portion BM may be a black matrix. The light blocking portion BM may be formed by including an inorganic light blocking material and/or an organic light blocking material containing a black pigment and/or a black dye. The light blocking portion BM may prevent or reduce a light leakage phenomenon and demarcate a boundary between adjacent filters CF-B, CF-G, and CF-R.

The color filter layer CFL may further include a buffer layer BFL. For example, the buffer layer BFL may be a protective layer that protects the filters CF-B, CF-G, and CF-R. The buffer layer BFL may be an inorganic material layer including at least one of silicon nitride, silicon oxide, or silicon oxynitride. The buffer layer BFL may be formed of a single layer or a plurality of layers.

In an embodiment, the first filter CF-B of the color filter layer CFL is illustrated to overlap the second filter CF-G and the third filter CF-R, but the present disclosure is not limited thereto. For example, the first to third filters CF-B, CF-G, and CF-R may be divided (e.g., separated) by the light blocking portion BM and may not overlap with each other. In one or more embodiments, the first to third filters CF-B, CF-G, and CF-R may be respectively disposed to correspond to the blue light-emitting region PXA-B, the green light-emitting region PXA-G, and the red light-emitting region PXA-R.

In one or more embodiments, the display device DD may include, as the light control layer PP, a polarizing layer in place of the color filter layer CFL. The polarizing layer may block or reduce external light provided from the outside to the display panel DP. The polarizing layer may block or reduce some of the external light.

In addition, the polarizing layer may reduce reflected light obtained by reflecting external light by the display panel DP. For example, the polarizing layer may function to block or reduce reflected light when light provided from the outside of the display device DD enters the display panel DP and exits again. The polarizing layer may be a circular polarizer having an antireflection function, or the polarizing layer may include a linear polarizer and a A/4 phase retarder. In one or more embodiments, the polarizing layer may be disposed and exposed on the base layer BL, or the polarizing layer may be disposed below the base layer BL.

Hereinafter, a method of manufacturing a light-emitting element will be described in more detail with reference to FIGS. 9A to 16. The structural features of the light-emitting element described with reference to FIGS. 1 to 8 will not be described again herebelow, and the features of the method of manufacturing the light-emitting element will be described in more detail.

Figure 9A:
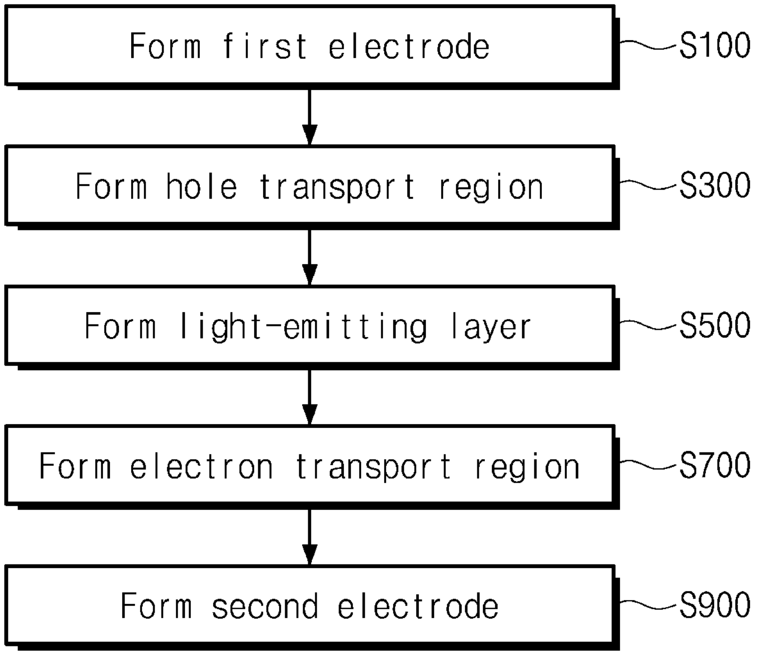
FIG. 9A is a flowchart illustrating a method of manufacturing a light-emitting element according to an embodiment.
Figure 9B:
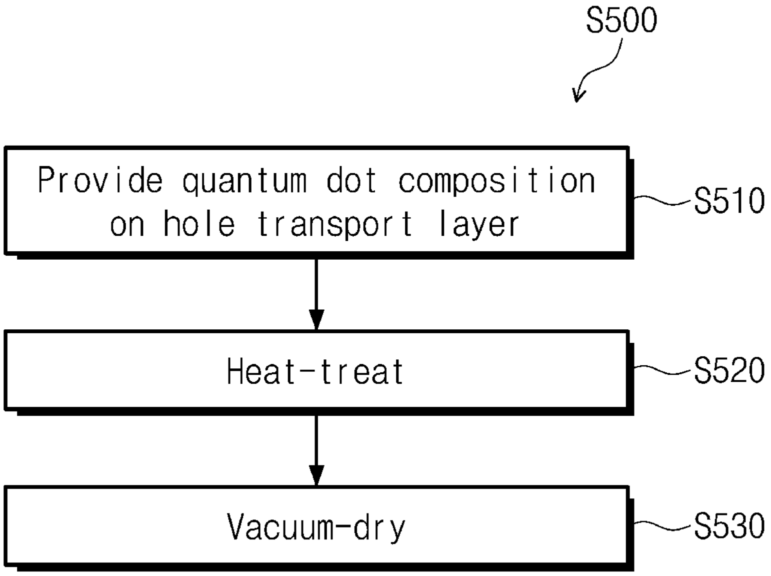
FIG. 9B is a flowchart illustrating an operation (e.g., one process) in a method of manufacturing a light-emitting element according to an embodiment.

FIG. 9A is a flowchart illustrating a method of manufacturing a light-emitting element according to an embodiment. FIGS. 9B, 13, and 15B are flowcharts illustrating specific operations in the method of manufacturing a light-emitting element according to an embodiment. FIGS. 10A to 11, 12A, 12B, 14 and 15A are diagrams illustrating specific operations in a method of manufacturing a light-emitting element according to an embodiment.

Referring to FIGS. 9A and 9B, a method of manufacturing a light-emitting element according to an embodiment includes forming a first electrode (S100), forming a hole transport region (S300), forming a light-emitting layer (S500), forming an electron transport region (S700), and forming a second electrode (S900). The forming of the light-emitting layer (S500) in an embodiment may include providing a quantum dot composition on a hole transport region (S510), heat-treating (e.g., providing heat treatment on the quantum dot composition) (S520), and vacuum-drying (e.g., vacuum-drying the quantum dot composition) (S530).

Figure 10A:
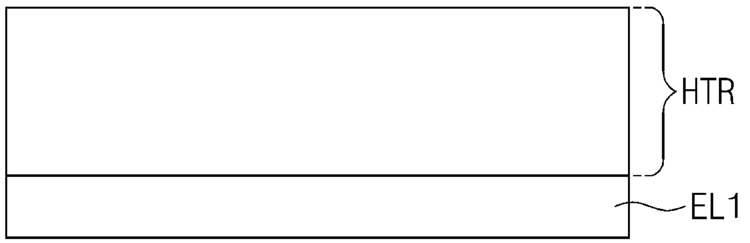
FIG. 10A is a diagram schematically illustrating an operation (e.g., one process) in a method of manufacturing a light-emitting element according to an embodiment.
Figure 10B:
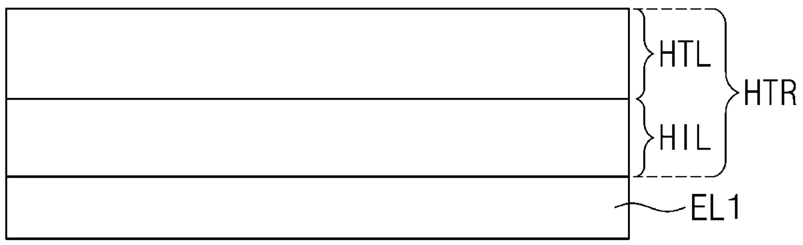
FIG. 10B is a diagram schematically illustrating an operation (e.g., one process) in a method of manufacturing a light-emitting element according to an embodiment.

FIG. 10A is a diagram schematically illustrating a result of performing the forming of the first electrode (S100) and the forming of the hole transport region (S300). The forming of the hole transport region (S300) may include providing a hole transport material on the first electrode EL1. Referring to FIG. 10B, in an embodiment, the forming of the hole transport region may include forming a hole injection layer HIL, and forming a hole transport layer HTL on the hole injection layer HIL.

Figure 11:
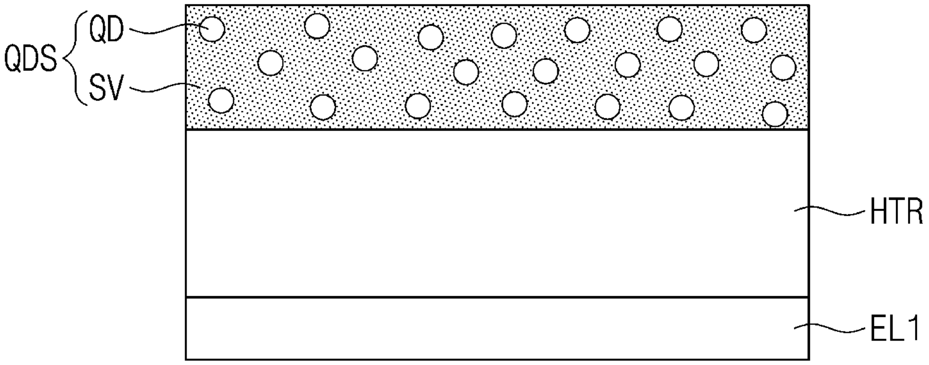
FIG. 11 is a diagram schematically illustrating an operation (e.g., one process) in a method of manufacturing a light-emitting element according to an embodiment.

FIG. 11 is a diagram schematically illustrating providing a quantum dot composition on a hole transport region (S510). Referring to FIG. 11, the quantum dot composition QDS may include quantum dots QD and an organic solvent SV. The organic solvent SV may be a substituted or unsubstituted aromatic compound, or a substituted or unsubstituted cyclic aliphatic compound. For example, the organic solvent SV may include at least one of hexylcyclohexane, n-octyl benzene, dodecyl benzene, 1-ethyl naphthalene, or diisopropyl biphenyl. However, this is only an example, and the present disclosure is not limited thereto. Thus, the organic solvent SV may be utilized without limitation as long as the organic solvent SV does not dissolve, at room temperature, the hole transport material included in the hole transport region HTR for which the heat treatment has completed, but dissolves the hole transport material at a temperature higher than room temperature.

The quantum dot composition QDS may include 2 wt % to 15 wt % of the quantum dots QD with respect to the total weight of the quantum dot composition QDS. When the quantum dot composition QDS contains less than 2 wt % of the quantum dots, the light-emitting layer EL-QD (FIG. 4) may not be formed (e.g., may not be suitably formed); and when the quantum dot composition QDS contains more than 15 wt % of the quantum dots, the flow of electrons may be disturbed and the current may not flow (e.g., may not flow suitably).

Figure 12A:
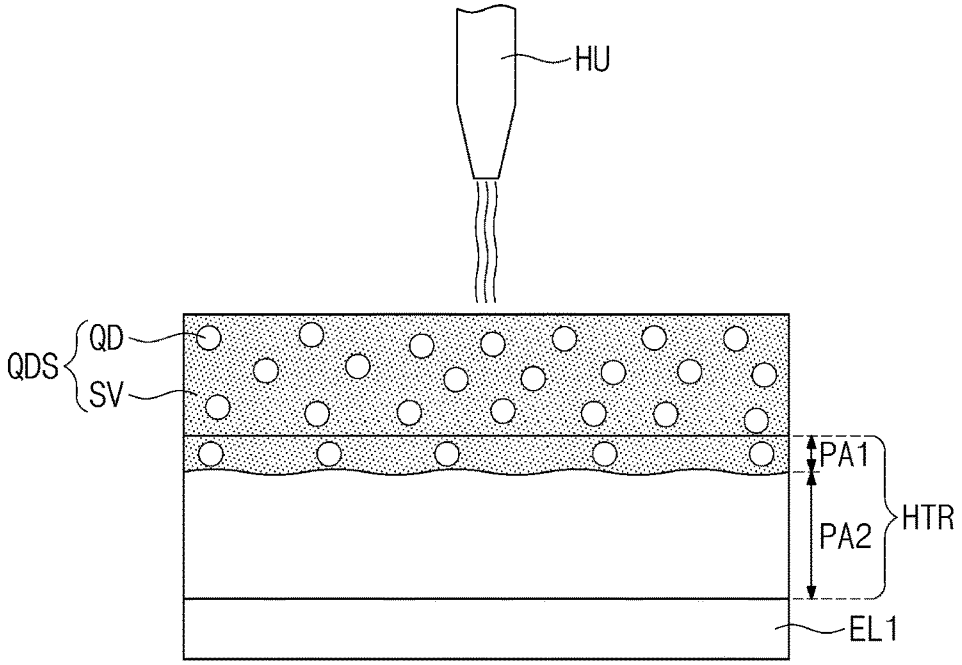
FIG. 12A is a diagram schematically illustrating an operation (e.g., one process) in a method of manufacturing a light-emitting element according to an embodiment.
Figure 13:
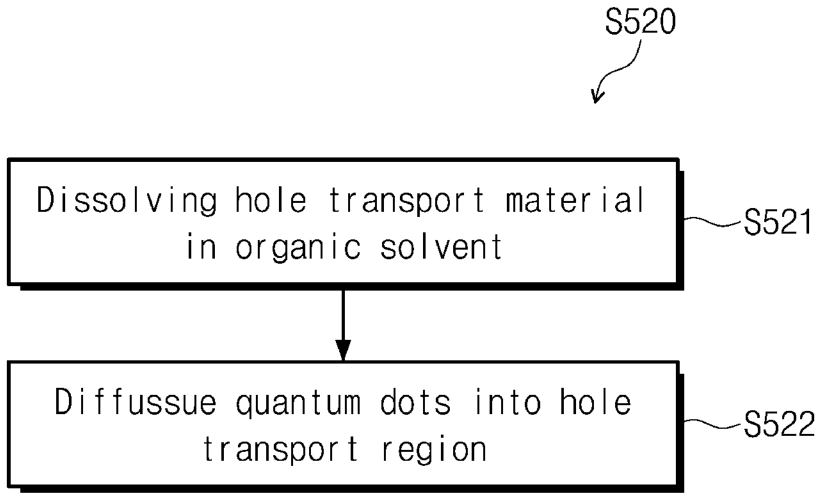
FIG. 13 is a flowchart illustrating an operation (e.g., one process) in a method of manufacturing a light-emitting element according to an embodiment.

FIG. 12A is a diagram schematically illustrating the heat-treating (S520). The heat-treating (S520) may provide (e.g., may be providing) heat to the quantum dot composition QDS provided (e.g., deposited) on the hole transport region HTR through a heat supply unit HU. Although FIG. 12A illustrates that the heat supply unit HU provides heat from the upper portion of the quantum dot composition QDS, this is only an example, and the present disclosure is not limited thereto. The heat supply unit HU may be disposed on the side surface of the quantum dot composition QDS to provide heat, or may be placed around (e.g., may surround) a light-emitting element being manufactured to provide heat.

The heat-treating (S520) may include causing the quantum dot composition QDS to infiltrate into the hole transport region HTR. That is, the heat-treating (e.g., heat treatment) (S520) may cause the quantum dot composition QDS to infiltrate into the hole transport region HTR. After the heat-treating (S520), the hole transport region HTR may include the infiltrated quantum dots QD. The hole transport region HTR may be divided into a first portion PA1 that contains the infiltrated quantum dots QD and a second portion PA2 that does not contain the infiltrated quantum dots QD. The second portion PA2 may be more adjacent (e.g., closer) to the first electrode EL1 than the first portion PA1. That is, the first portion PA1, after the light-emitting element ED (FIG. 4) is completely manufactured, may be more adjacent (e.g., closer) to the light-emitting layer EL-QD (FIG. 4) than the second portion PA2.

The heat-treating (S520) may be performed at about 50° C. to about 200° C. When the heat-treating (S520) is performed at about 50° C. or less (e.g., at less than 50° C.), the hole transport material may not be dissolved in the organic solvent SV, and thus the quantum dot composition QDS may not infiltrate into the hole transport region HTR. When the heat-treating (S520) is performed at about 200° C. or higher, the quantum dots QD may be damaged.

Figure 12B:
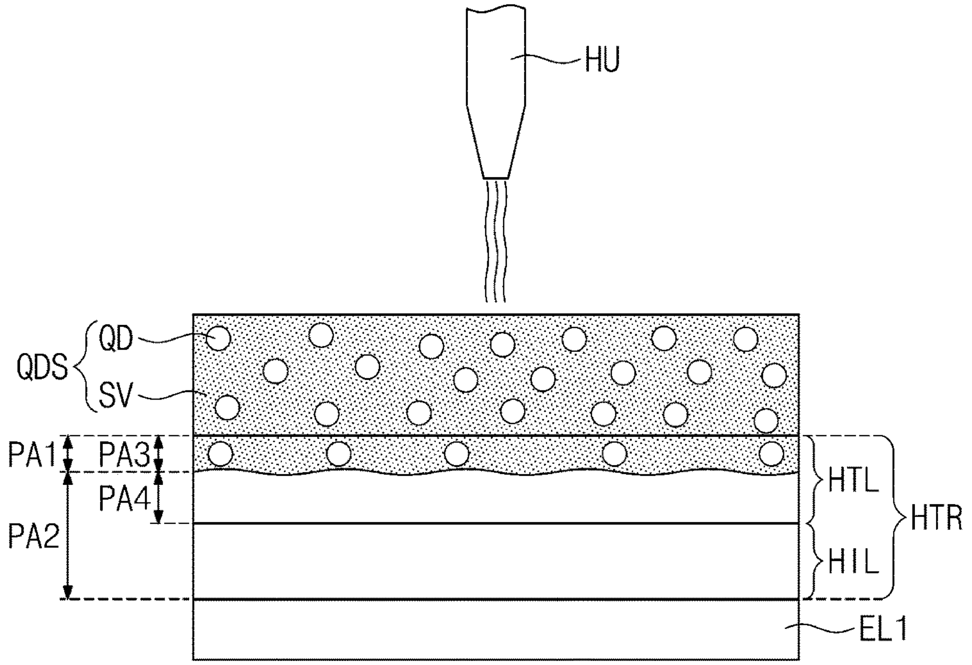
FIG. 12B is a diagram schematically illustrating an operation (e.g., one process) in a method of manufacturing a light-emitting element according to an embodiment.

Referring to FIG. 12B, the heat-treating (S520) in an embodiment may include causing the quantum dot composition QDS to infiltrate into the hole transport layer HTL. That is, the heat-treating (e.g., heat treatment) (S520) may cause the quantum dot composition QDS to infiltrate into the hole transport region HTR. After the heat-treating (S520), the hole transport layer HTL may include the quantum dots QD. The hole transport layer HTL may be divided into a third portion PA3 that contains the infiltrated quantum dots QD and a fourth portion PA4 that does not contain the infiltrated quantum dots QD. That is, the third portion PA3, after the light-emitting element ED (FIG. 5) is completely manufactured, may be more adjacent (e.g., closer) to the light-emitting layer EL-QD (FIG. 5) than the fourth portion PA4. The third portion PA3 may correspond to the first portion PA1.

FIG. 13 is a flowchart illustrating specifically the heat-treating (e.g., the heat-treating process) (S520). Referring to FIG. 13, the heat-treating (S520) in an embodiment may include dissolving the hole transport material in an organic solvent (S521), and diffusing the quantum dots into the hole transport region (S522).

The dissolving of the hole transport material in an organic solvent SV (S521) may include dissolving the hole transport material when an organic solvent SV, which does not dissolve the hole transport material at room temperature, receives heat (e.g., is heated to a higher temperature). The organic solvent SV may dissolve the hole transport material and infiltrate into the hole transport region HTR (e.g., after being heated).

The diffusing of the quantum dots into the hole transport region (S522) may include diffusing the quantum dots QD from the quantum dot composition QDS adjacent to the hole transport region HTR to the organic solvent SV that infiltrates into the hole transport region HTR.

Figure 14:
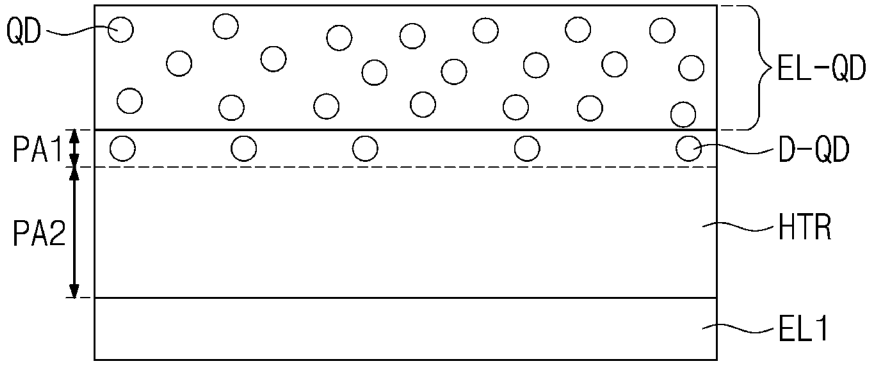
FIG. 14 is a diagram schematically illustrating an operation (e.g., one process) in a method of manufacturing a light-emitting element according to an embodiment.

FIG. 14 is a diagram schematically illustrating a result of performing the vacuum-drying (S530). Referring to FIG. 14, the vacuum-drying (S530) may include removing the organic solvent SV contained in the quantum dot composition QDS (FIG. 11). The light-emitting layer EL-QD including quantum dots QD may be formed on the hole transport region HTR by removing the organic solvent SV from the quantum dot composition QDS provided on the hole transport region. The hole transport region HTR including quantum dots QD may be formed by removing the organic solvent SV from the quantum dot composition QDS that infiltrates into the hole transport region HTR.

Because the organic solvent SV is removed from the quantum dot composition after the vacuum-drying (S530), the hole transport material may not be dissolved (again) even if the heat-treating (S520, FIG. 12A) is performed again. Therefore, even if the heat-treating (S520, FIG. 12A) is performed again, the quantum dots QD do not infiltrate into the hole transport region HTR again. In the method of manufacturing a light-emitting element according to an embodiment, the heat-treatment (S520, FIG. 12A) is performed prior to the vacuum-drying (S530), so that the quantum dots QD included in the quantum dot composition QDS may diffuse into the hole transport region HTR.

Figure 15A:
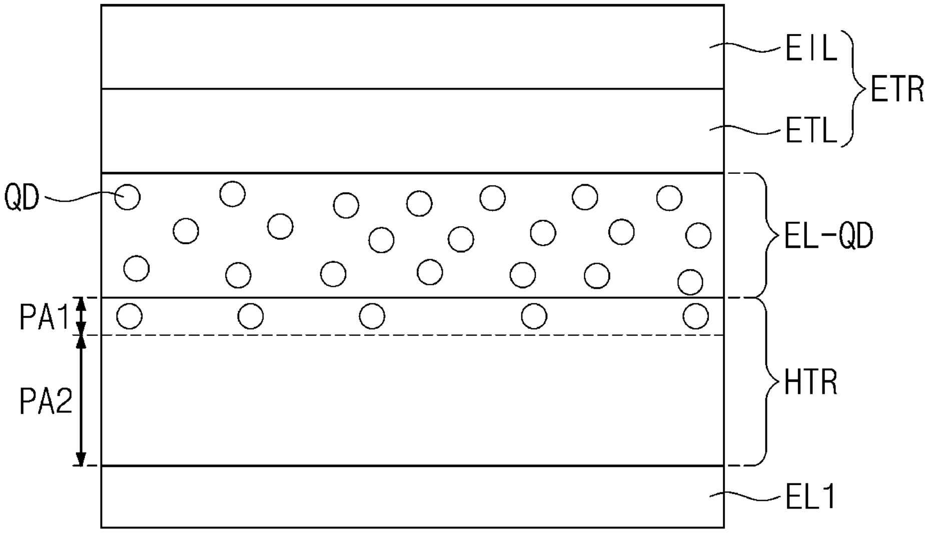
FIG. 15A is a diagram schematically illustrating an operation (e.g., one process) in a method of manufacturing a light-emitting element according to an embodiment.
Figure 15B:
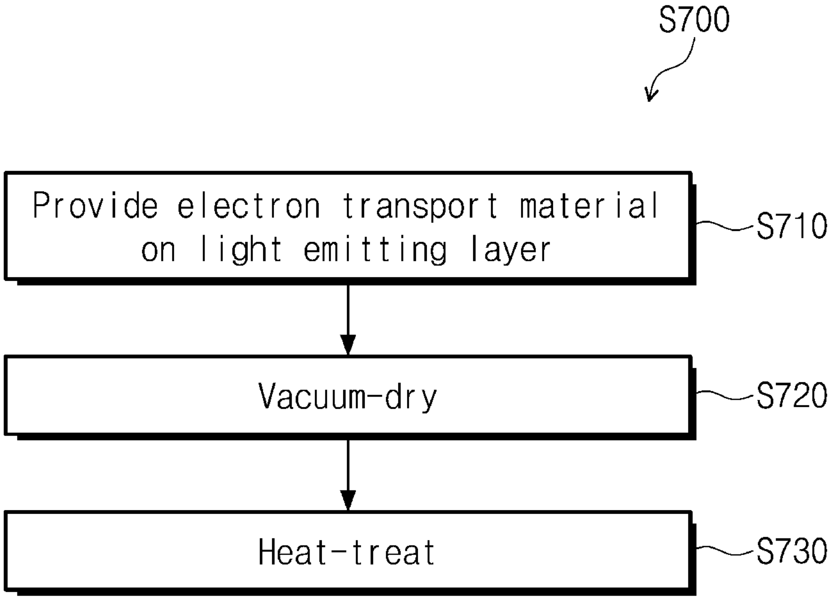
FIG. 15B is a flowchart illustrating an operation (e.g., one process) in a method of manufacturing a light-emitting element according to an embodiment.

FIG. 15A is a diagram schematically illustrating a result of performing the forming of the electron transport region (S700). FIG. 15B is a flowchart illustrating the forming of the electron transport region in more detail (S700).

Referring to FIGS. 15A and 15B, the forming of the electron transport region (S700) may include providing an electron transport material on the light-emitting layer EL-QD (S710), vacuum-drying (S720), and heat-treating (S730).

The vacuum-drying (S720) may include removing an organic solvent included in the electron transport material deposited on the light-emitting layer. The heat-treating (S730) may include heat-treating the vacuum-dried electron transport material to form the electron transport region ETR. The forming of the electron transport region ETR in an embodiment may include forming an electron injection layer EIL to inject electrons, and forming an electron transport layer ETL on the electron injection layer EIL.

Figure 16:
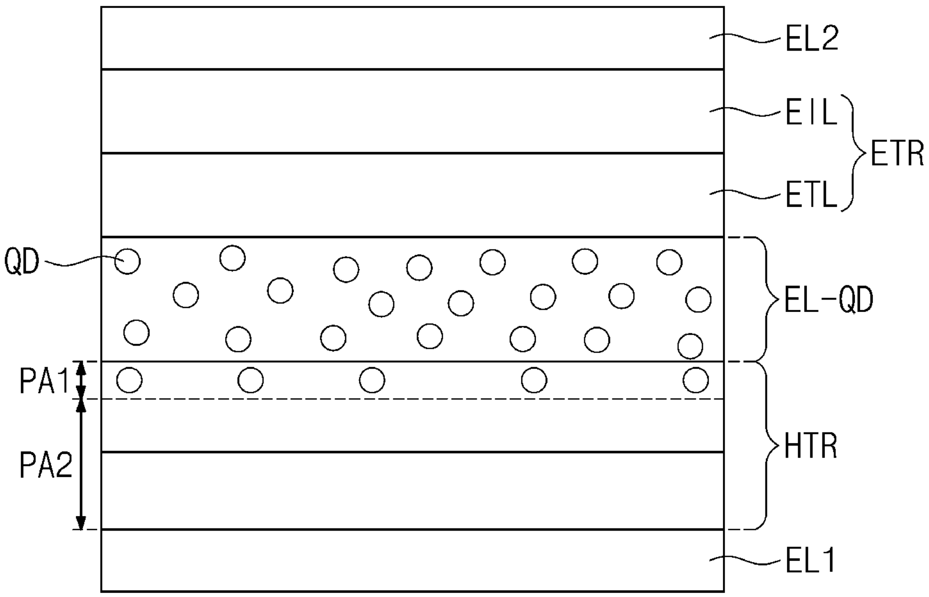
FIG. 16 is a diagram schematically illustrating an operation (e.g., one process) in a method of manufacturing a light-emitting element according to an embodiment.

FIG. 16 is a diagram schematically illustrating forming a second electrode (S900). Referring to FIG. 16, the forming of the second electrode (S900) may include forming the second electrode EL2 on the electron transport region ETR.

Hereinafter, a light-emitting element according to an embodiment of the present disclosure will be described in more detail with reference to Example and Comparative Example. In addition, Example shown below is to aid understanding of the present disclosure, and the scope of the present disclosure is not limited thereto.

Example

A light-emitting element was manufactured by forming, on a patterned ITO substrate, a hole injection layer, a hole transport layer, a light-emitting layer, an electron transport layer, and a second electrode in this order. The hole injection layer, the hole transport layer, the light-emitting layer, and the electron transport layer were each formed utilizing a spin coating method, and the second electrode was formed utilizing a vapor deposition method. The hole injection layer has a thickness of 1400 Å, the hole transport layer has a thickness of 400 Å, the light-emitting layer has a thickness of 200 Å, and the electron transport layer has a thickness of 500 Å. Each layer except for the light-emitting layer was formed and then vacuum-dried under $10^{-3}$ Torr, followed by a baking process for 30 minutes. The light-emitting layer was subjected to a baking process for 10 minutes before the vacuum-drying process, followed by vacuum-drying, and again a baking process (e.g., a second baking process) was then performed for 10 minutes after the vacuum-drying process.

Comparative Example

A light-emitting element of Comparative Example was manufactured in the same manner as in Example except that the vacuum-drying was performed in advance before the baking process. That is, the light-emitting layer was formed by conducting the vacuum-drying process first, followed by a baking process.

Evaluation of Characteristics of Light-Emitting Elements

Figure 17:
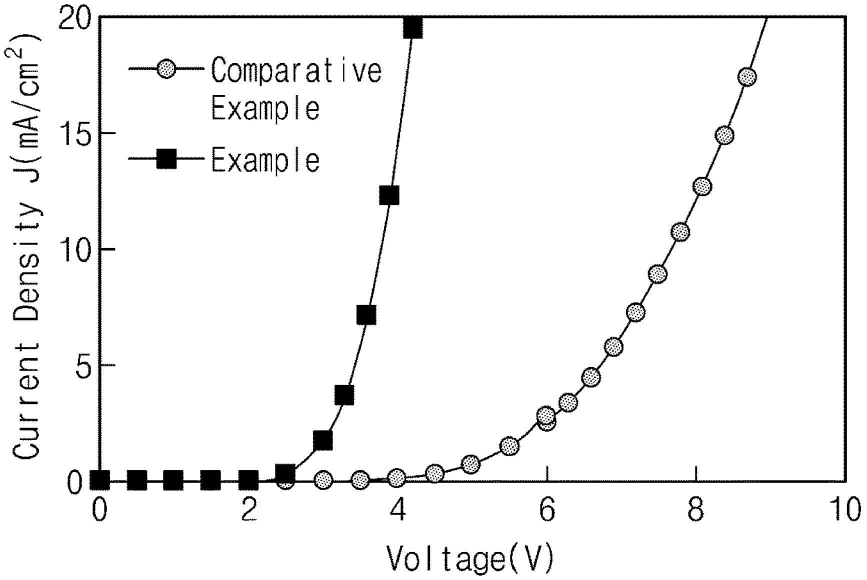
FIG. 17 is a diagram showing current density versus driving voltage in light-emitting elements according to Example and Comparative Example.
Figure 18:
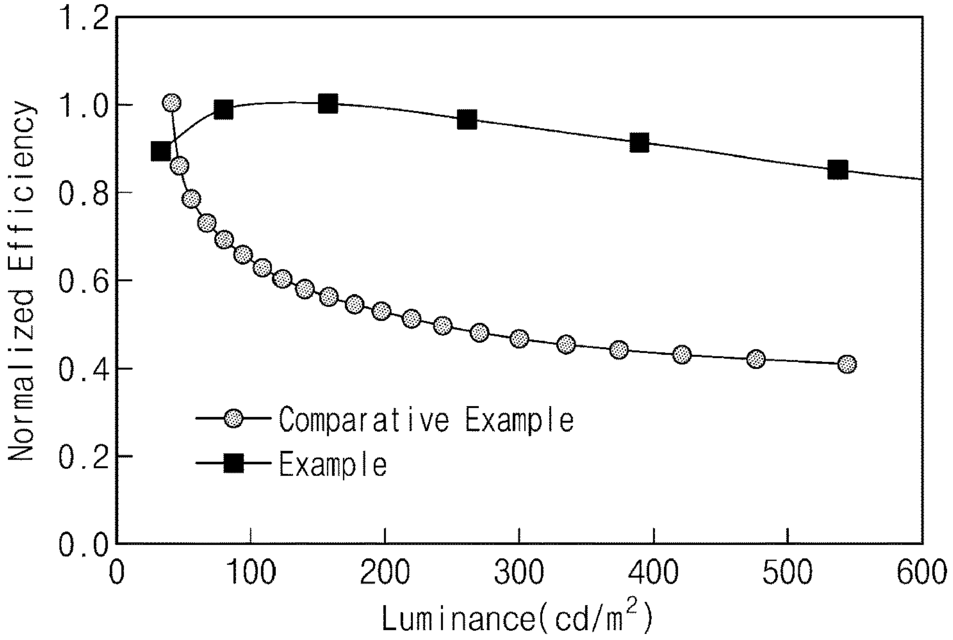
FIG. 18 is a diagram illustrating luminous efficiency versus luminance in light-emitting elements according to Example and Comparative Example.

The driving voltage and efficiency of each of the quantum dot light-emitting elements manufactured in the above Example and Comparative Example were measured utilizing the following method, and the results thereof are shown in FIGS. 17 and 18. The luminance was measured by supplying power from a current-voltmeter (Keithley SMU 236) and utilizing a luminance meter (PR650). The luminous efficiency was measured by supplying power from a current-voltmeter (Keithley SMU 236) and utilizing a luminance meter (PR650).

FIG. 17 is a diagram showing a current density versus a driving voltage in light-emitting elements according to Example and Comparative Example. FIG. 18 is a diagram illustrating a luminous efficiency versus a luminance in light-emitting elements according to Example and Comparative Example.

Referring to FIG. 17, it was confirmed that the current density of the light-emitting element according to Example is further increased at a lower voltage than the light-emitting element according to Comparative Example. Therefore, it may be confirmed that the light-emitting element according to Example may be driven at a lower voltage than the light-emitting element according to Comparative Example.

Referring to FIG. 18, it was confirmed that the light efficiency of the light-emitting element according to Comparative Example rapidly decreases as the luminance increases, whereas the light efficiency of the light-emitting element according to Example does not rapidly decrease even if the luminance increases. Therefore, it may be confirmed that the light-emitting element according to Example has higher luminous efficiency even at a higher luminance than the light-emitting element according to Comparative Example.

In summary, it was confirmed that the light-emitting element according to Example has a lower driving voltage and higher luminous efficiency than the light-emitting element according to Comparative Example. This should be because (e.g., it may be caused by the fact that) the hole transport region of the light-emitting element according to Example includes quantum dots in a portion adjacent to the light-emitting layer, and as a result, the energy gap between the light-emitting layer and the hole transport region becomes smaller, so that hole transport is more actively performed.

In one or more embodiments, because the hole transport region including quantum dots is included in a portion adjacent to the light-emitting layer, the injection characteristics of charges into the light-emitting layer may be improved, thereby providing a light-emitting element having improved driving voltage and luminous efficiency and a display device including the same.

An embodiment may provide a method of manufacturing a light-emitting element, the method being capable of diffusing the quantum dots into the hole transport region by including, prior to vacuum-drying, heat-treating the quantum dot composition provided on the hole transport region.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that the present disclosure should not be limited to these example embodiments but various suitable changes and modifications may be made by one ordinary skilled in the art within the spirit and scope of the present disclosure as hereinafter claimed.

Accordingly, the technical scope of the present disclosure should not be limited to the contents described in the detailed description of the specification, but should be determined by the claims, and equivalents thereof.

What is claimed is:

1. A light-emitting element comprising:

a first electrode;

a light-emitting layer on the first electrode and comprising quantum dots;

a hole transport region between the first electrode and the light-emitting layer and comprising a first portion adjacent to the light-emitting layer, the first portion consisting of a hole transport material and quantum dots the same as those comprised in the light-emitting layer, and the first portion having a concentration gradient which is a distribution density of the quantum dots decreasing from a portion of the first portion adjacent to the light-emitting layer to a portion of the first portion further away from the light-emitting layer;

an electron transport region on the light-emitting layer; and a second electrode on the electron transport region, wherein an interface is defined between the light-emitting layer and the hole transport region, and the hole transport material is selected from the group consisting of a compound represented by Formula H-1, a phthalocyanine compound, N,N'-diphenyl-N, N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris (N,N-diphenylamino)triphenylamine (TDATA), 4,4',4"-tris {N-(2-naphthyl)-N-phenylamino}-triphenylamine (2-TNATA), polyaniline/dodecylbenzenesulfonic acid (PANI/DBSA), polyaniline/camphor sulfonic acid (PANI/CSA), (polyaniline)/poly(4-styrenesulfonate) (PANI/PSS), N,N'-di(naphthalene-1-yl)-N, N'-diphenyl-benzidine (NPB), 4-isopropyl-4'-methyldiphenyliodonium tetrakis(pentafluorophenyl) borate, a fluorine-based derivative, 4,4',4"-tris(N-carbazolyl) triphenylamine (TCTA), 4,4'-bis[N,N'-(3-tolyl)amino]-3,3'-dimethylbiphenyl (HMTPD), 1,3-Bis(N-carbazolyl)benzene (mCP), 9-(4-tert-butylphenyl)-3,6-bis (triphenylsilyl)-9H-carbazole (CzSi), 9-phenyl-9H-3,9'-bicarbazole (CCP), and 1,3-bis(1,8-dimethyl-9H-carbazol-9-yl)benzene (mDCP), Formula H-1

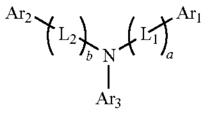

wherein in Formula H-1, $L_1$ and $L_2$ are each independently a substituted or unsubstituted arylene group having 6 to 30 ring-forming carbon atoms, or a substituted or unsubstituted heteroarylene group having 2 to 30 ring-forming carbon atoms, a and b are each independently an integer of 0 to 10, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, and $Ar_3$ is a substituted or unsubstituted aryl group having 6 to 30 ring-forming carbon atoms, wherein a substituent of the substituted arylene group, the substituted heteroarylene group, the substituted aryl group, and the substituted heteroaryl group is selected from the group consisting of a deuterium atom, a halogen atom, a cyano group, a nitro group, an amino group, a silyl group, an oxy group, a sulfinyl group, a sulfonyl group, a carbonyl group, a boron group, a phosphine oxide group, a phosphine sulfide group, an alkyl group, an alkoxy group, a hydrocarbon ring group, an aryl group, and a heterocyclic group.

2. The light-emitting element of claim 1, wherein the hole transport region comprises the first portion and a second portion not comprising the quantum dots.

3. The light-emitting element of claim 1, wherein the hole transport region comprises a plurality of organic layers, and an organic layer most adjacent to the light-emitting layer from among the plurality of organic layers comprises the quantum dots.

4. The light-emitting element of claim 1, wherein the hole transport region comprises a hole injection layer and a hole transport layer on the hole injection layer, and the hole transport layer comprises the quantum dots, and the hole injection layer does not comprise the quantum dots.

5. The light-emitting element of claim 4, wherein the hole transport layer comprises the first portion and a fourth portion not comprising the quantum dots.

6. The light-emitting element of claim 5, wherein a thickness of the first portion is smaller than a thickness of the fourth portion.

7. The light-emitting element of claim 5, wherein, in the first portion, the distribution density of the quantum dots in the portion adjacent to the light-emitting layer is greater than a distribution density of the quantum dots in a portion adjacent to the fourth portion.

8. The light-emitting element of claim 5, wherein a distribution density of the quantum dots decreases from the first portion to the fourth portion.

9. A display device comprising first to third light-emitting elements configured to emit light having different wavelengths, wherein each of the first to third light-emitting elements comprises:

a first electrode;

a light-emitting layer on the first electrode and comprising quantum dots;

a hole transport region between the first electrode and the light-emitting layer and consisting of:

a hole transport material, and quantum dots the same as those comprised in the light-emitting layer;

an electron transport region on the light-emitting layer; and a second electrode on the electron transport region, wherein an interface is defined between the light-emitting layer and the hole transport region, and wherein the hole transport region comprises:

a hole injection layer, and a hole transport layer on the hole injection layer, the hole transport layer comprising a first portion consisting of the hole transport material and the quantum dots and a fourth portion not comprising the quantum dots, and wherein, in the first portion, a distribution density of the quantum dots in a portion adjacent to the light-emitting layer is greater than a distribution density of the quantum dots in a portion adjacent to the fourth portion.

10. The display device of claim 9, wherein the first light-emitting element comprises a first light-emitting layer comprising first quantum dots configured to emit blue light, the second light-emitting element comprises a second light-emitting layer comprising second quantum dots configured to emit green light, and the third light-emitting element comprises a third light-emitting layer comprising third quantum dots configured to emit red light.

11. The display device of claim 10, wherein the first light-emitting element comprises a first hole transport region comprising the first quantum dots under the first light-emitting layer, the second light-emitting element comprises a second hole transport region comprising the second quantum dots under the second light-emitting layer, and the third light-emitting element comprises a third hole transport region comprising the third quantum dots under the third light-emitting layer.

12. An electronic device comprising a display device, the display device comprising first to third light-emitting elements configured to emit light having different wavelengths, wherein each of the first to third light-emitting elements comprises:

a first electrode;

a light-emitting layer on the first electrode and comprising quantum dots;

a hole transport region between the first electrode and the light-emitting layer and consisting of:

a hole transport material, and quantum dots the same as those comprised in the light-emitting layer;

an electron transport region on the light-emitting layer; and a second electrode on the electron transport region, wherein an interface is defined between the light-emitting layer and the hole transport region, and wherein the hole transport region comprises:

a hole injection layer, and a hole transport layer on the hole injection layer, the hole transport layer comprising a first portion consisting of the hole transport material and the quantum dots and a fourth portion not comprising the quantum dots, and wherein, in the first portion, a distribution density of the quantum dots in a portion adjacent to the light-emitting layer is greater than a distribution density of the quantum dots in a portion adjacent to the fourth portion.

* * * * *